US009462099B2

(12) United States Patent
Wilson et al.

(10) Patent No.: US 9,462,099 B2
(45) Date of Patent: Oct. 4, 2016

(54) MOBILE DEVICE CASE

(71) Applicant: Wimo Labs LLC, Chicago, IL (US)

(72) Inventors: Scott H. Wilson, Chicago, IL (US);
Michael Seum, Chicago, IL (US);
Gillian Rode, Chicago, IL (US); David B. Seal, Chicago, IL (US); Dennis M. Puhalla, Chicago, IL (US); Keith Alsberg, Chicago, IL (US); Jon Godston, Chicago, IL (US)

(73) Assignee: Wimo Labs LLC, Chicago, IL (US)

( * ) Notice: Subject to any disclaimer, the term of this patent is extended or adjusted under 35 U.S.C. 154(b) by 140 days.

(21) Appl. No.: 14/340,305

(22) Filed: Jul. 24, 2014

(65) Prior Publication Data

US 2015/0062787 A1    Mar. 5, 2015

Related U.S. Application Data

(60) Provisional application No. 61/893,672, filed on Oct. 21, 2013, provisional application No. 61/872,074, filed on Aug. 30, 2013.

(51) Int. Cl.
*H04M 1/18*  (2006.01)
*H05K 5/00*  (2006.01)
*H05K 5/02*  (2006.01)
*A45C 11/00*  (2006.01)

(52) U.S. Cl.
CPC ........ *H04M 1/185* (2013.01); *A45C 2011/002* (2013.01); *H05K 5/0013* (2013.01); *H05K 5/0217* (2013.01)

(58) Field of Classification Search
CPC . H04M 1/185; H05K 5/0013; H05K 5/0217; H05K 5/0086; H04B 1/3888; A45C 2011/002; G06F 2200/1633
See application file for complete search history.

(56) References Cited

U.S. PATENT DOCUMENTS

| 7,180,735 | B2 | 2/2007 | Thomas et al. |
| 7,594,576 | B2 | 9/2009 | Chen et al. |
| D616,361 | S | 5/2010 | Huang |
| 7,889,489 | B2 | 2/2011 | Richardson et al. |
| 7,889,498 | B2 | 2/2011 | Diebel et al. |
| D653,202 | S | 1/2012 | Hasbrook et al. |
| 8,342,325 | B2 | 1/2013 | Rayner |
| 8,367,235 | B2 | 2/2013 | Huang |
| 8,383,216 | B1 | 2/2013 | Hynecek |
| D683,338 | S * | 5/2013 | Wilson ......................... D14/250 |
| 8,479,875 | B2 | 7/2013 | Richardson et al. |
| 8,504,127 | B2 | 8/2013 | Altschul et al. |
| 8,509,864 | B1 | 8/2013 | Diebel |

(Continued)

*Primary Examiner* — Adrian S Wilson
*Assistant Examiner* — Abhishek Rathod
(74) *Attorney, Agent, or Firm* — Neal, Gerber & Eisenberg LLP

(57) ABSTRACT

A protective case for housing a mobile device is provided. The protective case comprises a top shell that seals against a top surface of a device and a bottom shell that cradles the back of the device. The top shell provides a downward extension along its perimeter that fits within a pocket formed around at least a portion of the perimeter of the bottom shell. At least the top shell forms an outward extending protrusion that is gripped by one or more backing elements that slide over the exterior of the bottom shell and extend up around the protrusion to grip the top shell and secure it to the bottom shell. Where upper and lower backing elements are used that meet at a parting line along the outer (exterior) surface of the bottom shell, a locking mechanism may be used to pull the backing elements together and hold them in place.

17 Claims, 22 Drawing Sheets

(56) References Cited

U.S. PATENT DOCUMENTS

| | | |
|---|---|---|
| 8,623,494 B2 | 1/2014 | Richardson et al. |
| 8,624,111 B2 | 1/2014 | Tages et al. |
| 8,640,867 B2 | 2/2014 | Szucs et al. |
| 8,640,868 B2 | 2/2014 | O'Dowd et al. |
| 8,708,151 B2 | 4/2014 | Whitten et al. |
| 2007/0071423 A1* | 3/2007 | Fantone .............. G03B 17/08 396/27 |
| 2007/0158220 A1 | 7/2007 | Cleereman et al. |
| 2007/0190829 A1* | 8/2007 | Tu ...................... H01M 2/1066 439/136 |
| 2011/0043086 A1* | 2/2011 | Cui ...................... G06F 1/1626 312/293.3 |
| 2011/0228458 A1 | 9/2011 | Richardson et al. |
| 2012/0275025 A1* | 11/2012 | Parrill .................. G02B 23/16 359/511 |
| 2012/0314354 A1 | 12/2012 | Rayner |
| 2013/0063004 A1* | 3/2013 | Lai ...................... G06F 1/1688 312/223.1 |
| 2013/0126531 A1 | 5/2013 | Hynecek et al. |
| 2013/0146491 A1 | 6/2013 | Ghali et al. |
| 2013/0271922 A1* | 10/2013 | Wilson ................ H04M 1/185 361/724 |
| 2013/0292288 A1* | 11/2013 | Willes ................. H04M 1/185 206/521 |
| 2014/0262847 A1* | 9/2014 | Yang ................... A45C 11/00 206/37 |
| 2015/0214991 A1* | 7/2015 | Ranchod .............. H04M 1/04 455/575.8 |

* cited by examiner

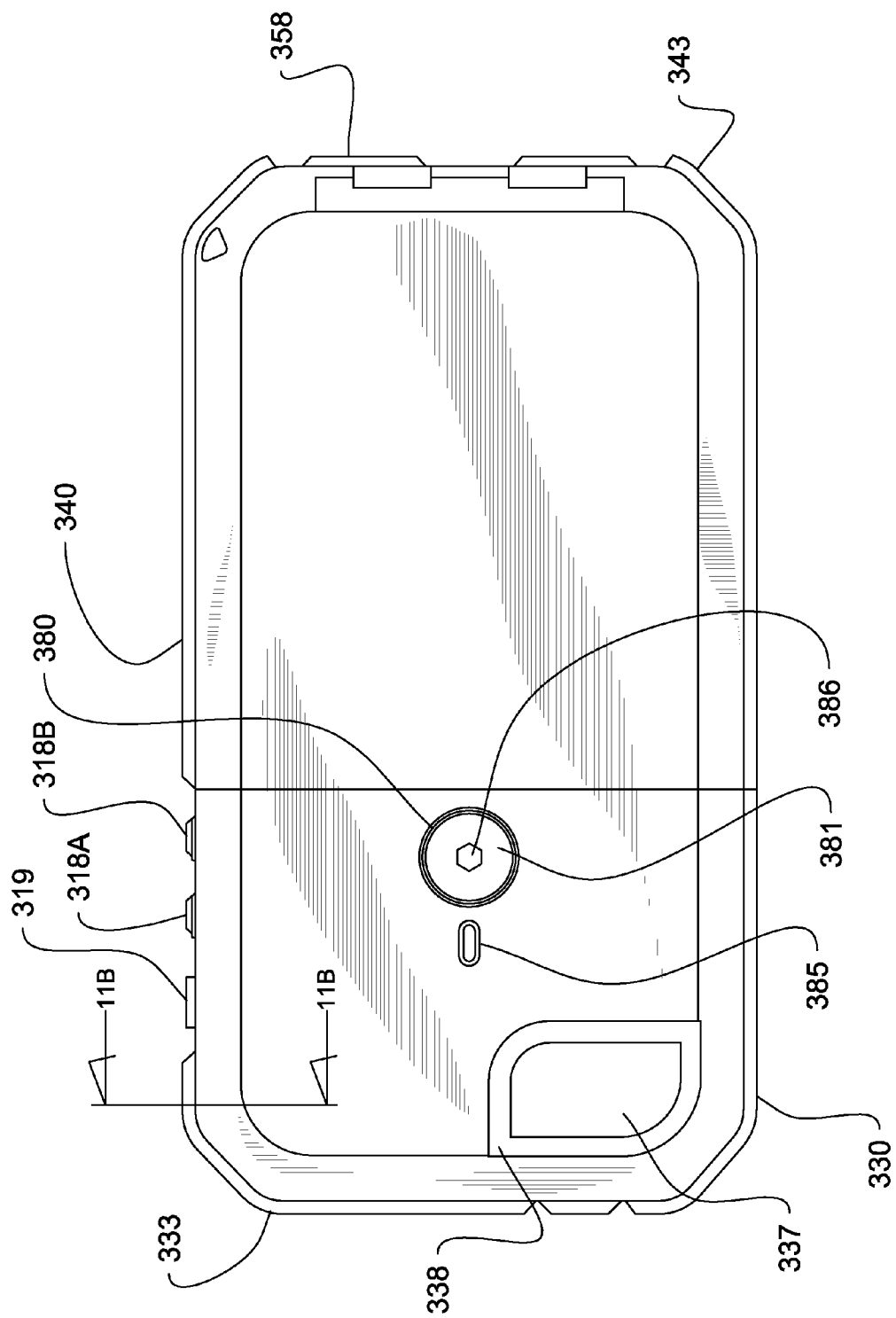

MOBILE DEVICE CASE

CROSS-REFERENCE TO RELATED APPLICATIONS

This non-provisional patent application claims priority to U.S. Provisional Patent App. Nos. 61/872,074 filed on Aug. 30, 2013 and 61/893,672 filed on Oct. 21, 2013. These provisional applications are incorporated herein by reference in their entirety.

TECHNICAL FIELD

Generally, this application relates to cases for portable electronic devices, and more particularly, to cases that may be used to protect a portable electronic device (or, more simply, a "device"). As used herein, the term "hand-held electronic device" may include any type of wireless communication devices, such as, e.g., mobile telephone, tablet, portable computer, gaming device, media player, smart phone, personal organizer, and the like. Though the primary embodiment discussed herein relates to a case for a mobile phone, it will be understood that the principles of the invention could be adapted to other geometries for use with other hand-held electronic devices.

BACKGROUND

As mobile communication devices, PDAs, tablets and other consumer electronic devices have become commonplace, so have the various casings used to protect those devices. Simpler, inexpensive cases involve merely a bottom shell in which the phone is seated that provides side, top and bottom walls to wrap around the device, and a raised rim around its operative interface. Others seek to cover over the operative interface with a film or membrane to provide additional protection, or to attempt to seal the device and make the casing water-proof. Waterproof or water-resistant cases are typically of a clamshell variety, wherein top and bottom shells are fitted together around the mobile device. For clamshell-style casings, whether or not they involve a membrane, various mechanisms have been used to secure the two shells together, ranging from clamps to hinges. Simply pressing the two shells together and using an overlapping edge or press-fit is perhaps the simplest and most well-known means. However, such an over-lapping interface may wear down over time with repeated use and fail to provide a secure connection. Alternatively, more secure clamshell connections using extraneous hardware (clamps, hinges, etc.) are less user-friendly and more expensive.

SUMMARY OF THE INVENTION

The present invention provides a clam-shell style case for a handheld mobile device that features a user-friendly concept to secure the shells without extraneous hardware, yet that provides a robust connection and additional protection from impacts. The top component may or may not have a membrane over the operative interface of the device. The shells are secured together with upper and lower backing elements that are slid together along a protrusion formed by one or both of the clam shells. The backing elements provide additional impact resistance and protection to the device, while serving to hold the upper and lower shells securely together.

In some instances, the invention discloses a case for a mobile device comprising a rigid top shell forming a perimeter around a front face of the device; a bottom shell forming a cradle for a rear face of the device; and a backing element that, when the rigid top shell and the bottom shell are placed around the device, slides along first and second outward protrusions formed by at least the rigid top shell, the first protrusion extending along at least a portion of a first side edge of the device and the second protrusion extending along at least a portion of a second side edge of the device; wherein the backing element extends under the bottom shell and around the first and second protrusions, thereby securing the top shell and bottom shell together around the device.

In other instances, the invention discloses a case for a generally rectangular mobile device having a front surface with an interactive control panel thereon, a back surface, a top surface, a bottom surface and first and second side surfaces, the case comprising: a top shell forming a perimeter around the interactive control panel of the mobile device and comprising a first side wall extending toward the back surface of the device along the first side surface of the device, and a second side wall extending toward the back surface of the device along the second side surface of the device, each of the first and second side walls comprising a downward extension and an outward protrusion, each outward protrusion forming a rail that extends along at least a portion of its respective side wall; a bottom shell forming a cradle for the bottom surface of the mobile device and comprising a first upstanding perimeter wall along at least a portion of the first side surface of the mobile device and a second upstanding perimeter wall along at least a portion of the second side surface of the mobile device, each of the first and second upstanding perimeter walls forming a trench for receiving at least a portion of one of the downward extensions; and a backing element at least partially encompassing the bottom shell and having backing element side walls that extend substantially parallel to the first and second side surfaces of the mobile device, beyond the first and second perimeter walls of the bottom shell, and around the rails formed by the outward protrusions of the top shell in order to hold the top shell and bottom shell together around the mobile device.

In yet other instances, the invention discloses a waterproof, impact-resistant case for a handheld computing device, the device being of substantially rectangular proportions and having a front surface, a rear surface, a top edge, a bottom edge, and left and right side edges, the case comprising: a rigid top shell for placement over the front surface of the device, the top shell comprising side walls, each side wall extending from the front surface of the device, along the left or right side edge of the device to a side wall terminus near the rear surface of the device, each side wall comprising an outward protrusion extending away from the left and right side edges of the device and forming a top shelf along and parallel to the left and right side edges; a bottom shell having an interior surface for placement against the rear surface of the device and an exterior surface facing away from the device, the bottom shell forming left and right trenches along and parallel to the left and right side edges of the device, the trenches each configured to receive a side wall terminus of the top shell; an upper backing element extending across a portion of the exterior surface of the bottom shell and along a portion of the side walls of the top shell, the upper backing element comprising an overhang for sliding along the top shelf formed by the outer protrusions of the top shell; and a lower backing element extending across a portion of the exterior surface of the bottom shell and along a portion of the side walls of the top shell, the lower backing element comprising an overhang for sliding along the top shelf formed by the outer protrusions of the top shell; wherein the upper backing element and the lower backing element are configured to slide together along the top shelf such that they join together along a parting line between the top edge and the bottom edge of the device.

BRIEF DESCRIPTION OF THE DRAWINGS

The present invention can be better understood with reference to the following drawings. The components in the drawings are not necessarily to scale, emphasis instead being placed upon clearly illustrating the principles of the present invention. In the drawings, like reference numerals designate corresponding parts throughout the several views.

FIG. 7 is a rear view showing the back side of the case of FIG. 1A, fully assembled about a mobile device.

DETAILED DESCRIPTION

The description that follows describes, illustrates and exemplifies one or more particular embodiments of the present invention in accordance with its principles. This description is not provided to limit the invention to the embodiments described herein, but rather to explain and teach the principles of the invention in such a way to enable one of ordinary skill in the art to understand these principles and, with that understanding, be able to apply them to practice not only the embodiments described herein, but also other embodiments that may come to mind in accordance with these principles. The scope of the present invention is intended to cover all such embodiments that may fall within the scope of the appended claims, either literally or under the doctrine of equivalents.

Figure 1:
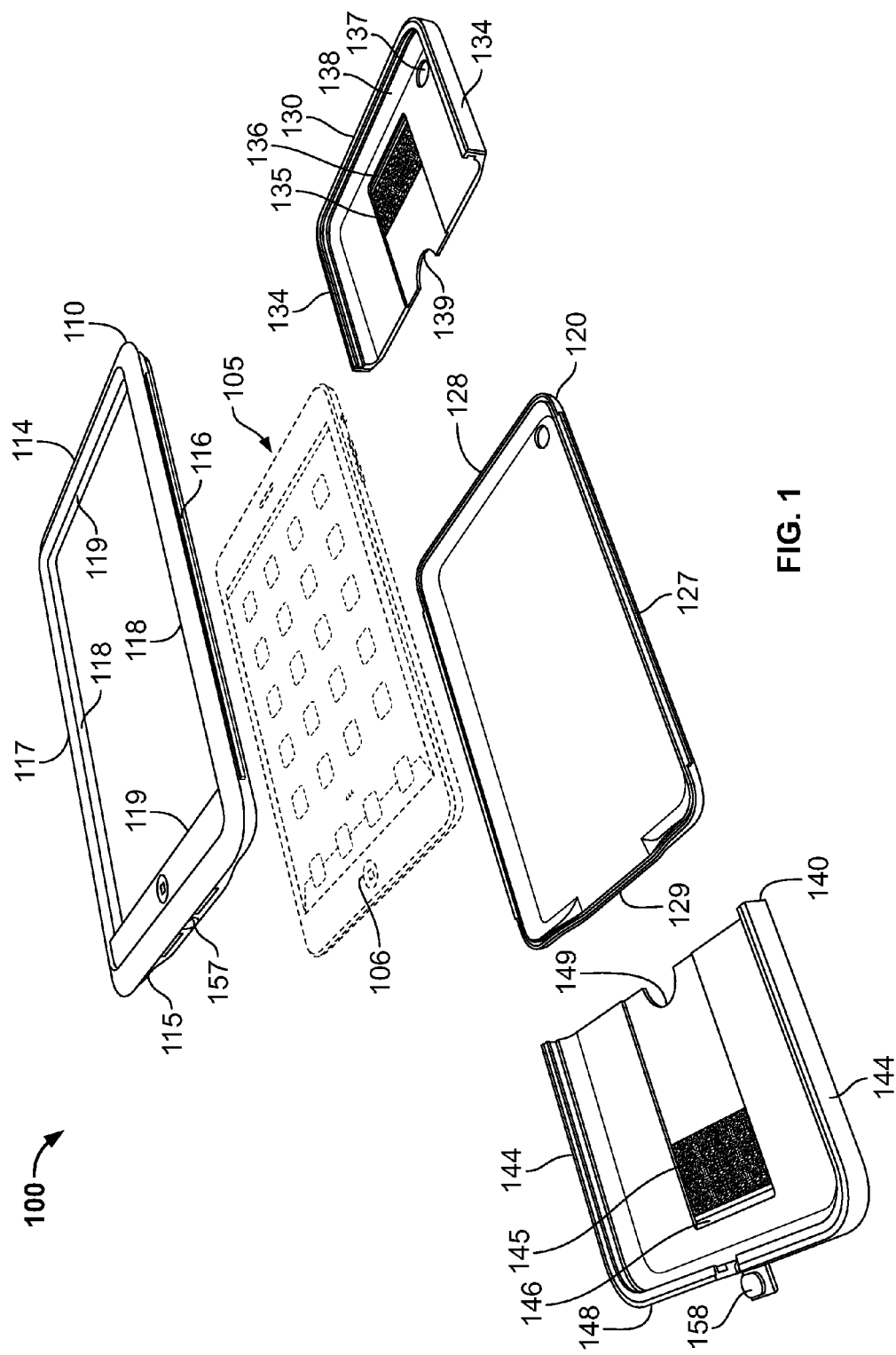
FIG. 1 is an exploded view of case components forming around a mobile device in accordance with a first exemplary embodiment.
Figure 2:
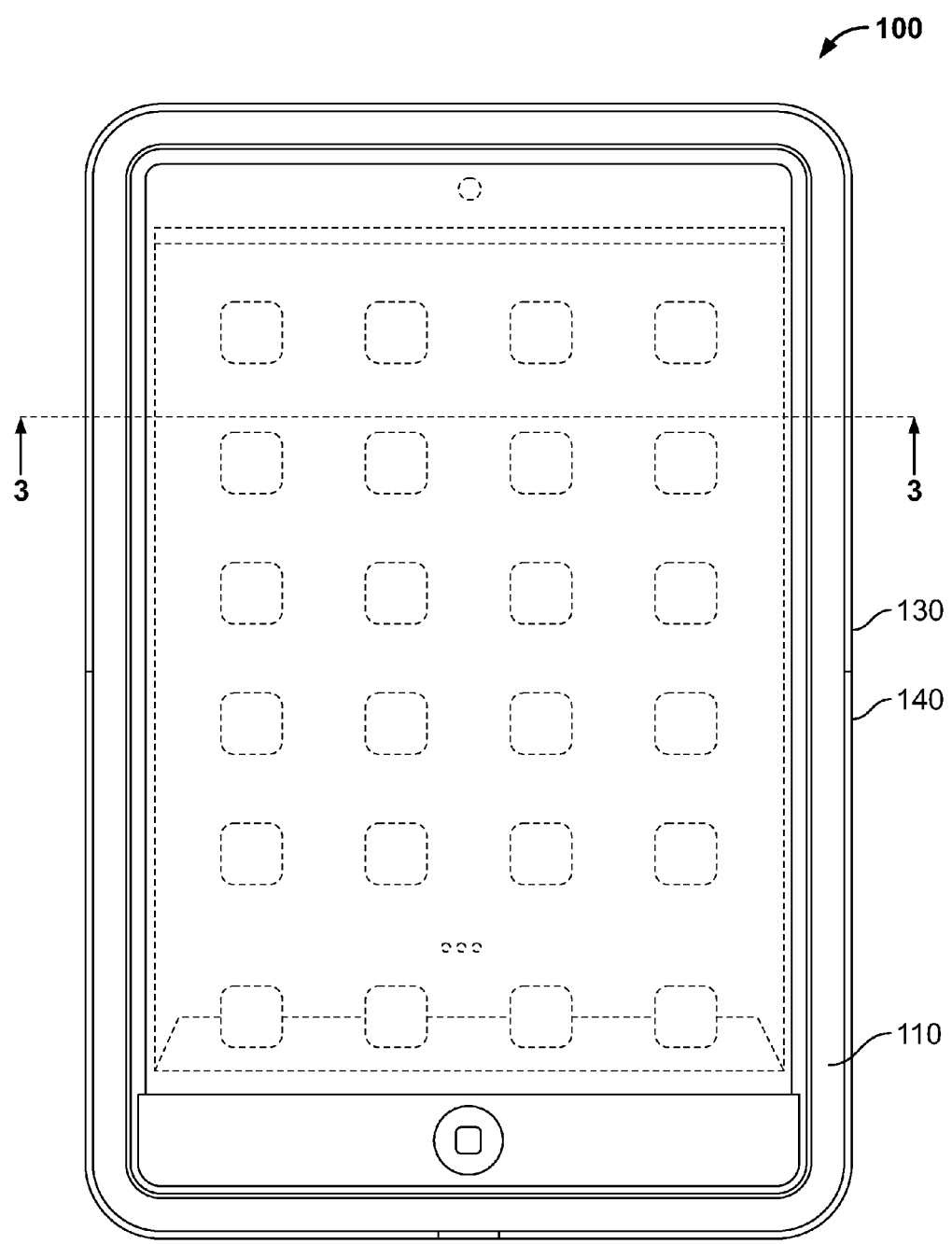
FIG. 2 is a frontal view of the case of FIG. 1 when fully assembled around a mobile device.

FIG. 1 shows an exploded view of a case 100 for a mobile device, such as an iPad® tablet. It will be understood that the components of the case, and the dimensions and shape, could be modified to fit other types of mobile devices without departing from the novelty of the invention. The case of FIG. 1 is comprised of four principle parts: a top shell 110, a bottom shell 120, and upper and lower backing elements 130, 140. These are shown in a fully-assembled condition around a mobile device 105 in FIG. 2, wherein the bottom shell 120 is fully enclosed and not in view. Generally, the top shell 110 and bottom shell 120 come together around the perimeter of the mobile device 105 to partially enclose it. Each of the top shell 110 and bottom shell 120 provide an outward protrusion 112, 122, said outward protrusions aligning with one another as shown in the cross section of FIG. 2. The upper and lower backing elements 130 and 140 each have a channel 132, 142 on either side sized to cooperate with the two outward protrusions 112, 122. The backing elements 130, 140 may be slid over the protrusions 112, 122 (with the protrusions in the channels 132, 142) until they meet. The channels 132, 142 serve to hold the top shell 110 and bottom shell 120 together around the mobile device 105. The two backing elements 130, 140 are then drawn together by turning a twist lock assembly 180 along the boundary where the backing elements come together. An optional harness strap 190 may be inserted into the backing elements 130, 140 so as to provide a grip for the device 105 when in the case 100.

The top shell 110 may be formed of a generally rigid plastic, such as polycarbonate. It is generally rectangular in shape, having top and bottom outer edges 114, 115 and opposing side outer edges 116, 117 that extend beyond the outer perimeter of the device to be enclosed. The top shell also has opposing inner edges 118 and top and bottom inner edges 119 that fit snugly against the device 105 along the edges of its screen. In some embodiments, the top shell 110 may contain a translucent membrane that covers the device screen (not shown). The top shell 110 provides a flexible overmold 111 aligned with the power control 106 for the device 105 so that the control may be operated while the device is in the case. It will be understood that this overmold can be moved or resized to fit with the operative controls of other devices. The top shell 110 also provides a perimeter seal 155 (see FIG. 3) along its inside perimeter for use in sealing against the device screen. The top shell 110 has a clasp retainer 157 along its bottom outer edge 115 for retaining a clasp that seals the power port (lightening port) of the device 105 (not shown) when not in use.

Figure 3:
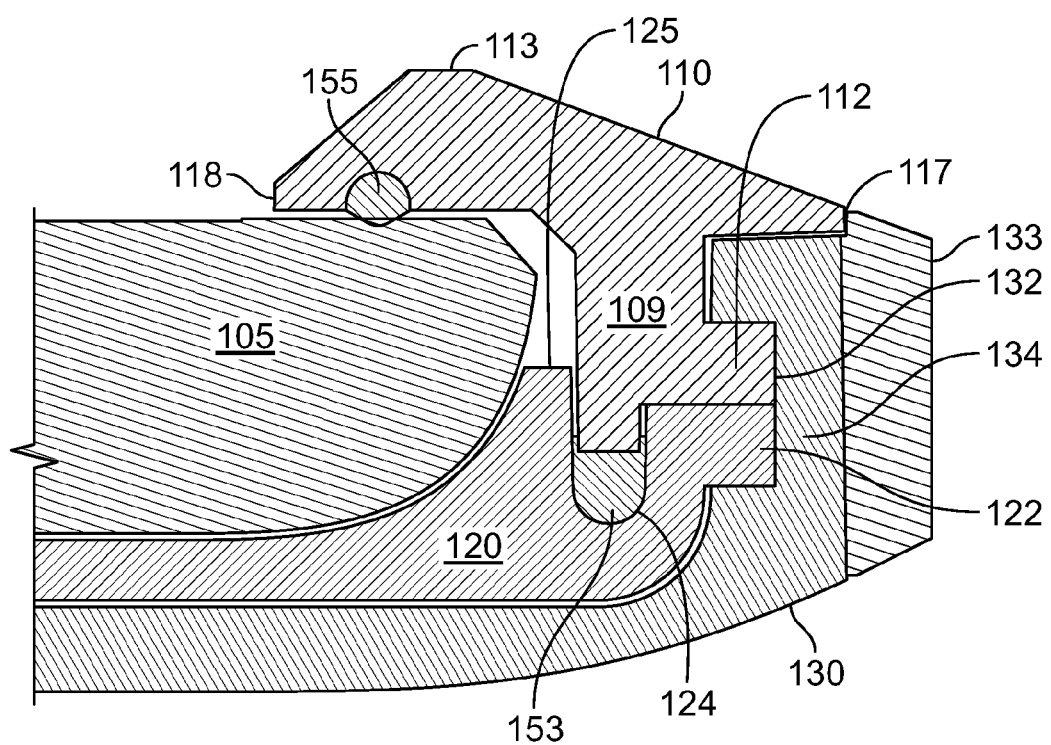
FIG. 3 is a section view of a side edge of the case of FIG. 1 taken through section 3 as shown in FIG. 2

A cross section of the top shell 110 is shown in FIG. 3. As shown, a perimeter seal 155 comes to rest on the surface of the device itself, near the inner perimeter of the inside edge 118. The shell 110 is raised toward its center to provide a protective rim 113 around the enclosed device 105, and then falls away toward its outer perimeter 117. Between its inner and outer perimeters 118, 117, the shell 110 comprises a downward extension 109 to partially form sidewalls for enclosing the device 105. Fixed to the bottom of the extension is a joining seal 153, which runs the perimeter of the shell 110. This seal 153 is made to fit into a pocket 124 formed in the bottom shell 120, as described below. The extension also comprises an outward protrusion 112 that is used to help secure the top shell 110 to the bottom shell 120, by way of the backing elements 130, 140.

The bottom shell 120 forms an open-faced housing for the device 105, and is designed to conform to the outer dimensions of the device 105. In the disclosed embodiment, the bottom shell 120 is a generally flat, rectangular object with slightly upstanding walls along its two sides 127, top 128 and bottom 129. A camera hole 123 is aligned with a camera lens in the device 105, and other such openings may be provided so as to allow interplay and function of other utilities of the device. These openings may be sealed with translucent windows in some embodiments. As shown in the cross-section of FIG. 3, the upstanding walls 125 of the bottom shell 120 cooperate with the downward shell extensions 109 to form the sidewalls of the device case 100. The upstanding walls 125 comprise a pocket 124 that accommodates a portion of the downward extension 109 of the top shell 110, and the joining seal 153 attached thereto. Ideally, the seal 153 will form a slight interference fit within the pocket 124 to help retain the top shell 110 and bottom shell 120 together prior to the backing elements 130, 140 being installed. However, note that there are no overlapping surfaces, locking mechanisms, ribs, or clasps that hold the two components 110, 120 together in FIG. 3. Instead, the bottom shell's upstanding walls provide a second outward protrusion 122 that cooperates with and aligns with the first outward protrusion 112 of the top shell 110, which are collectively held in place by the backing elements, 130, 140, as explained below.

The upper and lower backing elements 130, 140, essentially form a second layer bottom shell for the device 105, but with taller upstanding walls that extend above the sides 127, top 128 and bottom 129 walls of the bottom shell 120. The upper backing element 130 provides a generally flat inner surface, with an upstanding top wall 138 and upstanding side walls 134. There is no wall opposite the top wall. Instead, the flat inner surface simply drops off along an edge. In the disclosed embodiment, the edge is parallel to the top wall 138, but that is not required. In the center of the edge is a semi-circular punchout 139, which is used to help draw the backing elements 130 and 140 together, as explained below. Also along the flat surface is a hole 137 to align with the camera hole 123 in the bottom shell 120. In the illustrated embodiment, there is also Velcro, or some other retaining material 135 disposed at a central area near a slit 136. The slit 136 is better illustrated in FIG. 3, where the outside of the flat surface is illustrated. The purpose of the slit 136 and retaining material 135 is discussed below.

As shown best in the cross-section of FIG. 3, each side wall 134 provides a channel 132 that is used to secure the top shell protrusion 112 to the bottom shell protrusion 122 (thereby securing the top shell 112 to the bottom shell 122. In operation, a user places the top shell 112 and bottom shell 122 around the device 105, and then aligns the channel 132 of the upper backing element with the joined protrusions 112, 122, and slides the protrusions into the channel 132 until the top wall 128 of the bottom shell 120 fits up against the top wall 138 of the upper backing element 130. This same operation is also conducted with the lower backing element 140.

Figure 4:
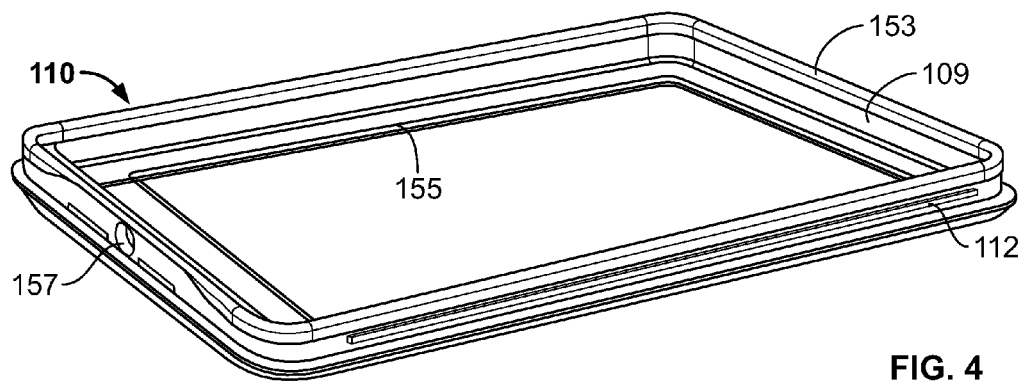
FIG. 4 is a perspective view of the inner side of the top shell of the case of FIG. 1.

The features of the lower backing element 140 mirror that of the upper backing element 130 except, in the illustrated embodiment, the camera hole is on the upper portion, and the power port is on the lower portion. Thus, as shown, the lightning port clasp 158 is hinged to the lower backing element 140 along its bottom wall. It will be understood that these features dependent on the location of controls and other inputs/outputs of the device to be encased will drive the location of these access features in the case 100. Otherwise, the lower backing element 140 has side walls 144 that feature a channel 142 designed to align with channel 132 in the upper backing element. Channel 142 (not shown in FIG. 3 because of where the section is taken), thus, also slides along the protrusions 112, 122 to help hold the top shell 110 and the bottom shell 120 together. Mirroring the upper backing element 130, the lower backing element 140 has a bottom wall 148, but no top wall. Instead, its flat inner surface that extends between side walls 144 drops off along an edge parallel to the bottom wall 148. This edge has a punchout 149 that mates with punchout 139 as shown in FIGS. 3 and 4 where the backing elements join together. The lower backing element 140 also features retaining material 145 and a slit 146.

As shown in FIG. 3, each of the backing elements 130, 140 may have a pliable overmold (shown as 133, corresponding to the upper backing element 130 in FIG. 1) along the outside of their side walls 134, 144. This overmold serves to allow pressure-based access to underlying device 105 controls, and also provides additional impact absorption in the event of drops.

Figure 6:
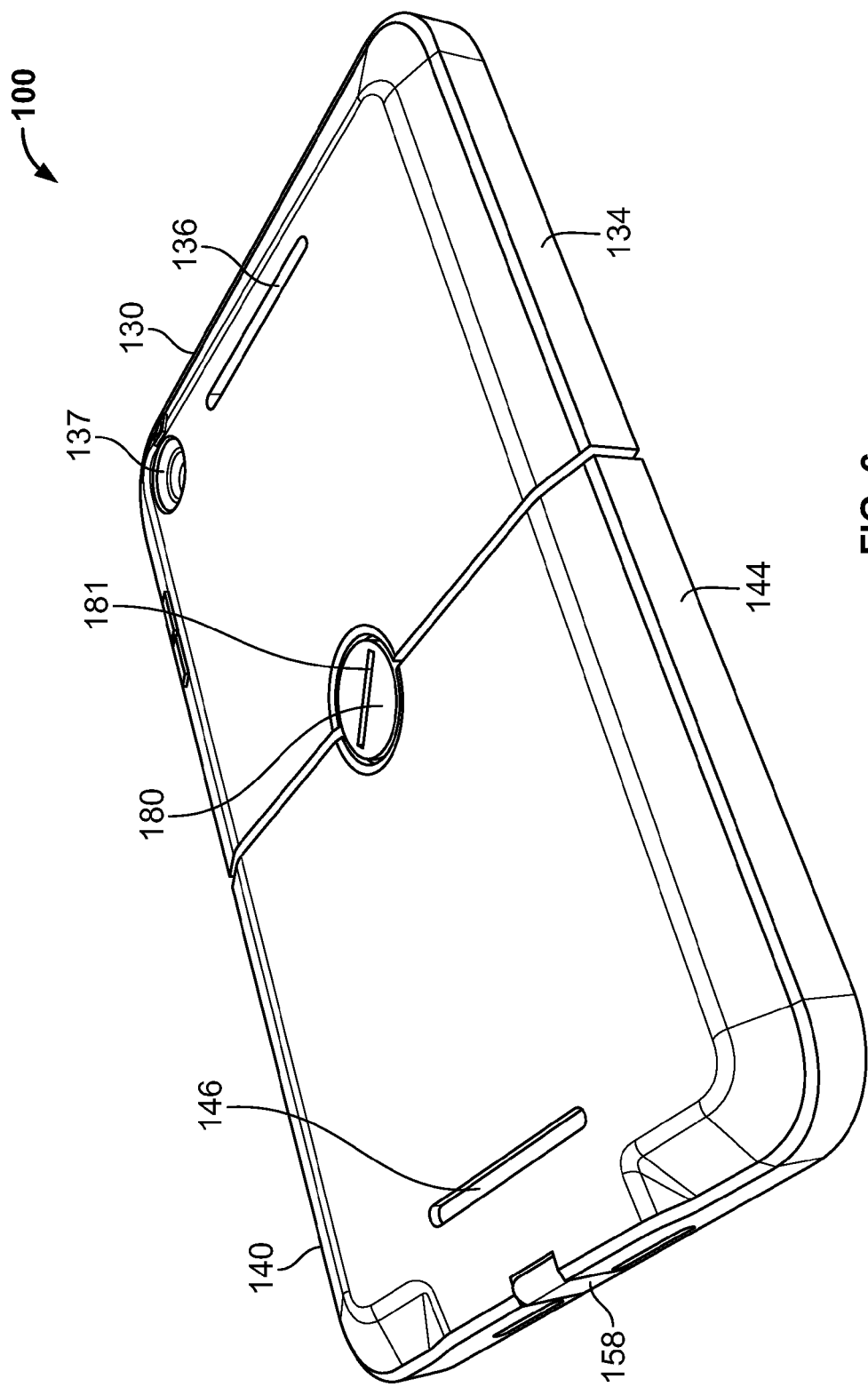
FIG. 6 is a perspective view of the outer (back) side of the case of FIG. 1 as it is being assembled about a mobile device.
Figure 6A:
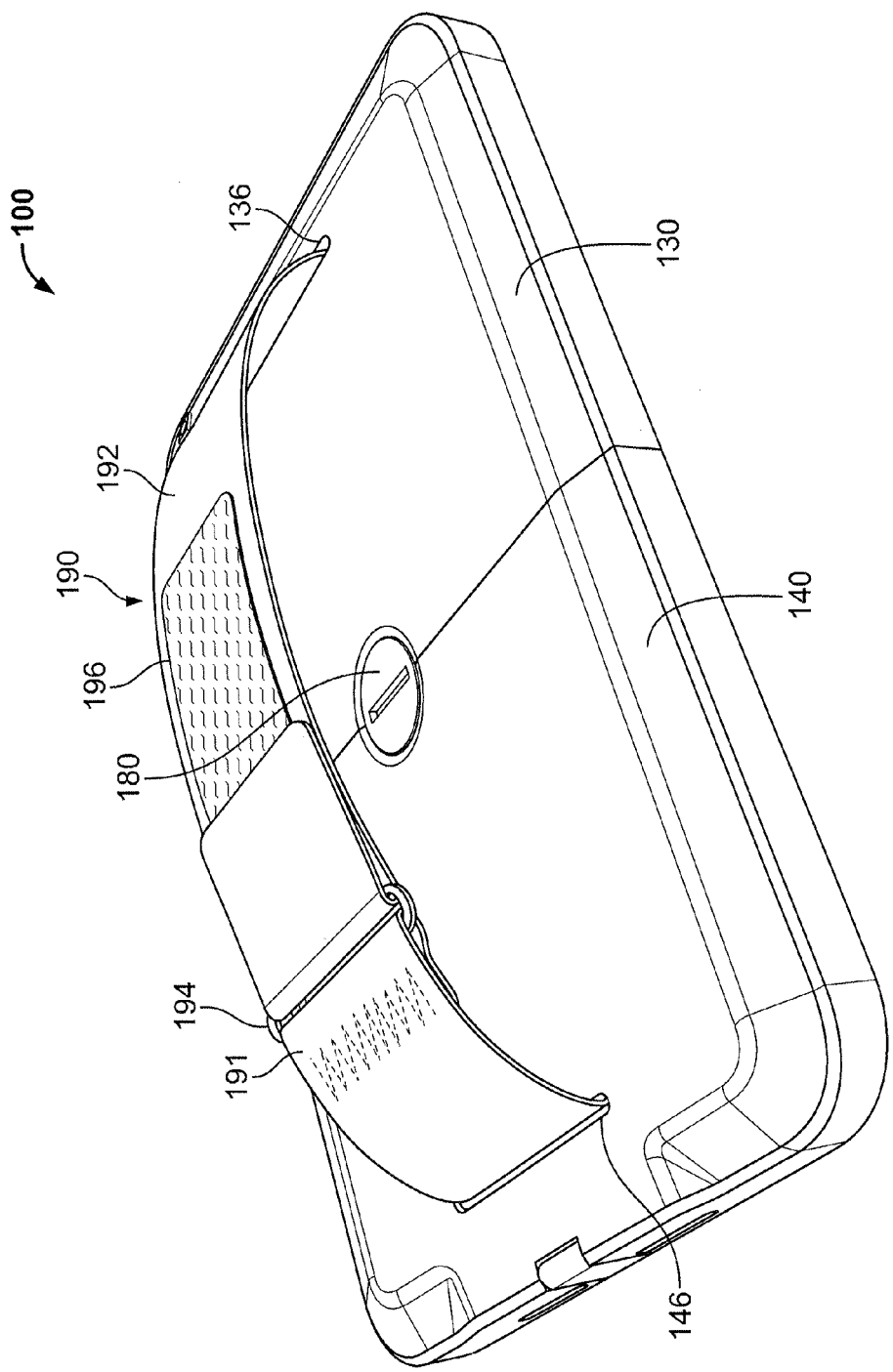
FIG. 6A is a perspective view like that of FIG. 6, but with the case fully assembled about a mobile device, and with an optional carrying strap installed.
Figure 6B:
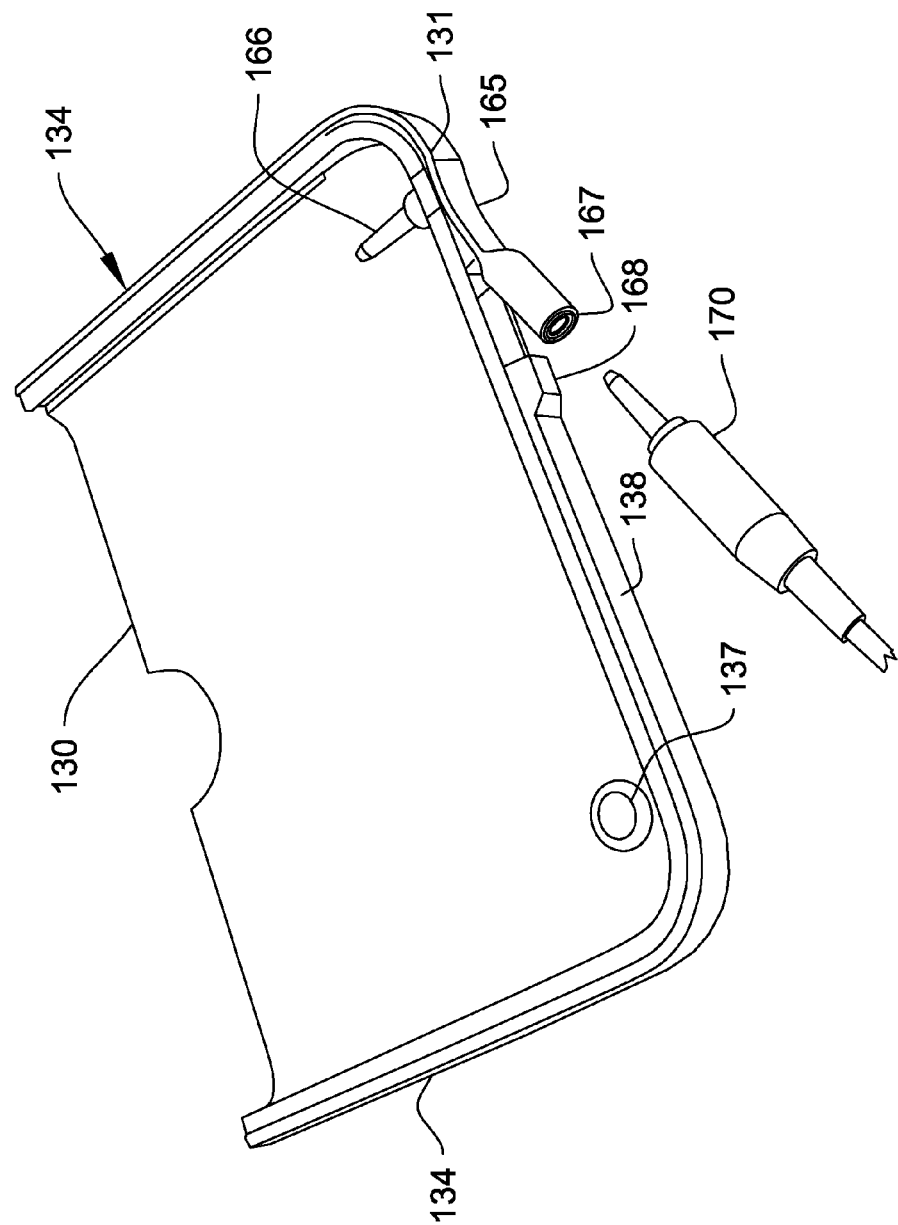
FIG. 6B is a perspective view of the inside of the upper backing element of the case of FIG. 1, illustrating a headphone jack connection.

Along the top wall 138 is a built-in phone jack extension assembly 165 (see FIG. 6B). A first end of the extension extends inward/downward from the top wall 138 directly toward the device 105 such that it fits within the headphone port of the device 105 when the case 100 is assembled and the device is installed therein. The other end of the extension 165 is a flexible cable that extends external to the case and provides a female adapter 167 for receiving a headphone jack. In this manner, the headphone port on the device 105 is protected and sealed off. The extension external to the case has a groove that it is pressed into along the outside of the top wall 138 when the phone port is not in use. The groove is fashioned such that the open end of the extension is sealed against a guard surface 168 formed in the top wall 138 to ensure no moisture gets through to the device 105.

Figure 5:
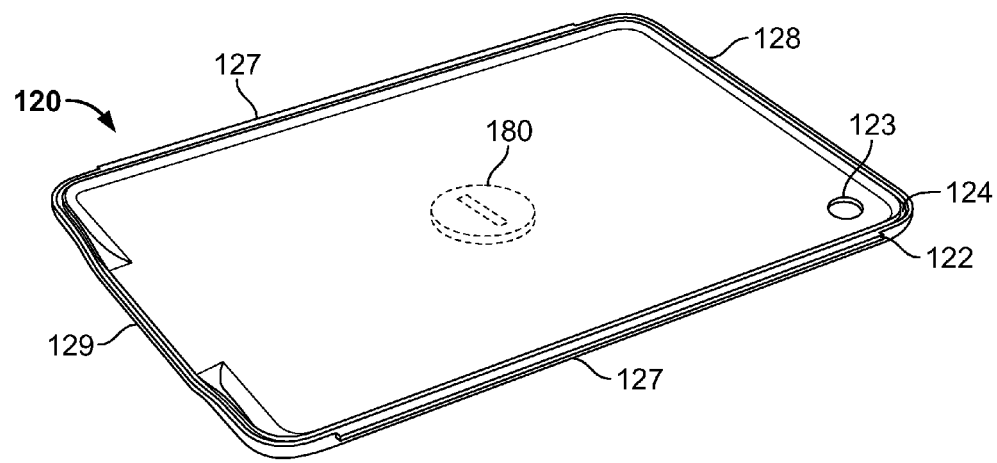
FIG. 5 is a perspective view of the inner side of the bottom shell of the case of FIG. 1, with hidden lines showing the twist lock assembly on its bottom side.

FIGS. 4 and 5 show the open, receiving sides of the top and bottom shells, respectively. As shown, the protrusion 112 of the top shell runs along the side wall, extending outward. The downward extension 109 shown in FIG. 3's cross section is actually extending upward here because the top shell 110 has been inverted to show its inside. Joining seal 153 runs the perimeter of the top shell to press fit into pocket 124 of the lower shell of FIG. 5. Perimeter seal 155 also runs the perimeter of the top shell, but along the underside of the protective rim 113, so as to seat against the mobile device 105 (not shown). The protrusion 122 of the lower shell 120 is also shown extending out from along a side so as to mate with protrusion 112. In hidden lines, the twist lock assembly 180 is shown. It is hidden here because it extends from the other side of the bottom shell, in the illustrated embodiment.

As shown in FIG. 6, once the upper and lower backing elements 130 and 140 are slid together, with the protrusions 112 and 122 fit into the channels 134, 144, the backing elements are drawn together with the twist lock assembly 180. The punchouts 139, 149 in the backing elements come together to form a hole along the back of the case through which the twist lock assembly 180 extends. In the illustrated embodiment, this hole is roughly centered in the back of case 100, but it will be understood that the location of the hole could be toward top wall 138, the bottom wall 148, or offset to either side, depending on the dimensions of the backing elements, and where the parting line is to be between them. The twist lock assembly 180 may take different forms. As shown in FIG. 6, it is a circular locking mechanism that fits into the hole formed by the punchouts 139, 149. The assembly provides a groove 181 that is used to rotate the twist lock and pull the backing elements together. In certain embodiments, this is assisted by screw ridges formed in the edges of the punchouts (not shown). FIG. 6A shows the case 100 with the twist lock 180 locked such that the case is sealed and the backing elements are pulled together.

Figure 8:
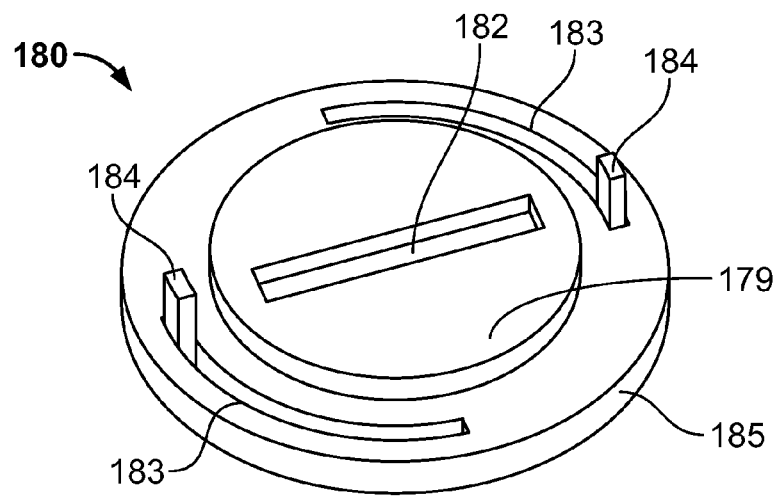
FIG. 8 is a close-up perspective view of the twist lock assembly of the bottom shell of the case of FIG. 1, according to certain embodiments.

Elements of the twist lock assembly 180 are fashioned into and extend outward from the bottom shell 120. As shown in FIG. 8, the twist lock assembly comprises a round plate 185 with two opposing tracks 183 and a hollow center. Extending through the hollow center of the plate 185 is a circular raised surface 179 connected (beneath plate 185— not shown) to two stops 184. The raised surface 179 extends through the hole formed by the punchouts 139, 149 in the backing elements when assembled. The raised surface 179 comprises a central handle 182 for use in operating the twist lock assembly 180, such as via insertion of a coin. Here, the handle 182 is an open slit for receiving the coin. When the coin is turned, the raised surface 179 rotates with respect to the plate 185, causing the stops 184 to move along the tracks 183. Each stop 184 rests on a spring which allows it to be retractable. The stops are dimensioned such that their upper surfaces are flush with the back of the backing elements when the case 100 is fully assembled.

FIG. 6B shows the inside of the upper backing element 130, with side walls 134 and top wall 138 extending upward. In addition to camera hole 137, there is also a jack port 131 shown as a cutaway along the top wall 138. Though the port could be left open for direct insertion of a headphone jack 170 in some embodiments, the illustrated embodiment utilizes a jack extension assembly 165 to facilitate connection to a jack in a sealed manner. Jack extension assembly 165 is comprised of a male component 166 (internal to the case 100) and a female component 167 (external to the case 100). In certain embodiments, the extension assembly 165 is permanently affixed and sealed to the jack port 131. As the backing element 130 is slid down over the combination top shell 110/bottom shell 120, the male component 166 aligns with the jack port 161 of the top shell (see FIG. 4) and, respectively, with a port hole in the mobile device 105. In order to connect to headphone jack 170, the external female component 167 is pulled away from the jack extension guard 168 formed in the top wall 138 of the upper backing element 130 where the female component 167 is retained and environmentally sealed when not in use.

Figure 9:
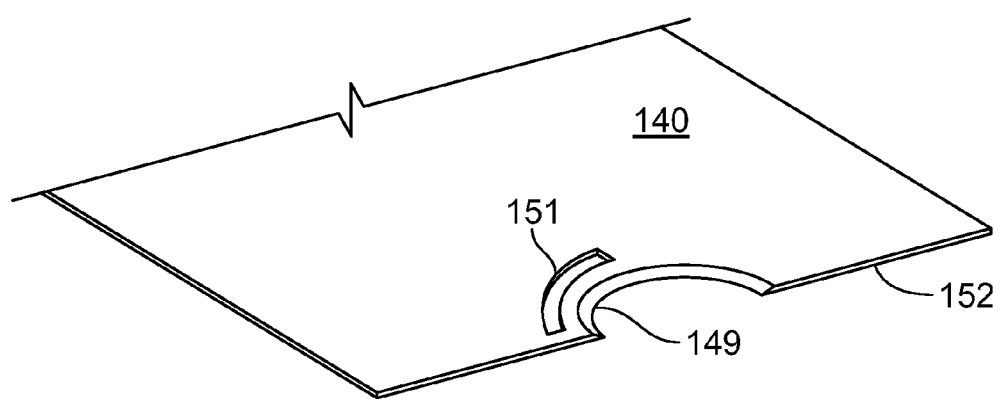
FIG. 9 is a corresponding section of the lower backing element of the case of FIG. 1 that mates with a portion of the twist lock assembly.

FIG. 9 shows a portion of the lower backing element 140 in an embodiment designed to cooperate with the locking assembly of FIG. 8. As shown, the backing elements in this embodiment have quarter-circle slits 151 corresponding to the tracks 183, such as that shown in FIG. 6. When the backing elements 130, 140 are slid toward one another, the stops 184 extending from the twist lock assembly 180 at the center of the bottom shell 120 are depressed against the inner surfaces of the backing elements and pop back out into the quarter slits 151 cut into the back of the backing elements once in place. The stops 184 are fixed to and aligned with the handle 182, such that they move along the tracks 183 of the twist lock assembly 180 when the handle 182 is turned. Initially parallel to the boundary between the backing elements, the handle 182 is turned ninety degrees clockwise, causing the stops 184 (now extending through the quarter-circle slits 151 in the backing elements) to pull the backing elements together. It may be advantageous to have backing seals 152 along the meeting edges of the backing elements 130, 140, which may be compressed together by the twist locking action, thereby forming a tight seal.

As a final optional step, a strap assembly 190 may be installed for user convenience. With reference to FIG. 6A, the strap assembly comprises a short portion 191, a long portion 192, and a joining clasp 194. The joining clasp 194 is permanently fixed to a second end of the short portion 192. Each of the short and long portions 191, 192 have retaining material 195 (e.g., Velcro) on a first end (not shown) that is designed to fit through one of the slits 136, 146 in one of the backing elements 130, 140 so as to come into contact with the retaining material 135, 145 on the insides thereof. It may be easier to connect these first ends to the insides of the backing elements and feed them through the slits 136, 146 from the inside out prior to assembly of the backing elements over the bottom shell 120. With the backing elements installed and locked together, and the second ends of the short and long portions 191, 192 extending through the backs of the backing elements, the second end of the long portion is fed through the clasp and sealed back against itself against external retaining material 196. As shown in FIG. 6A, the external retaining material 196 and length of the longer strap 192 may allow for adjustability of the strap 190.

Figure 10:
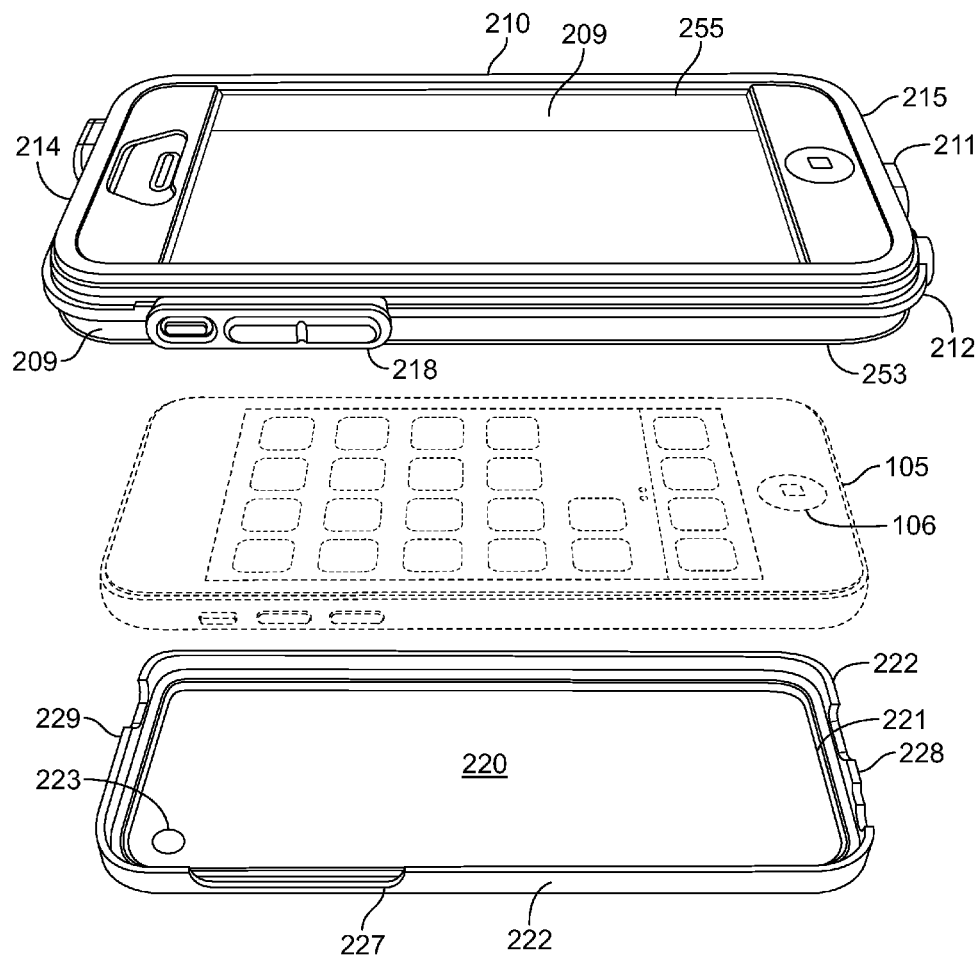
FIG. 10 is an exploded view of top and bottom shells of a case according to a third exemplary embodiment.
Figure 14:
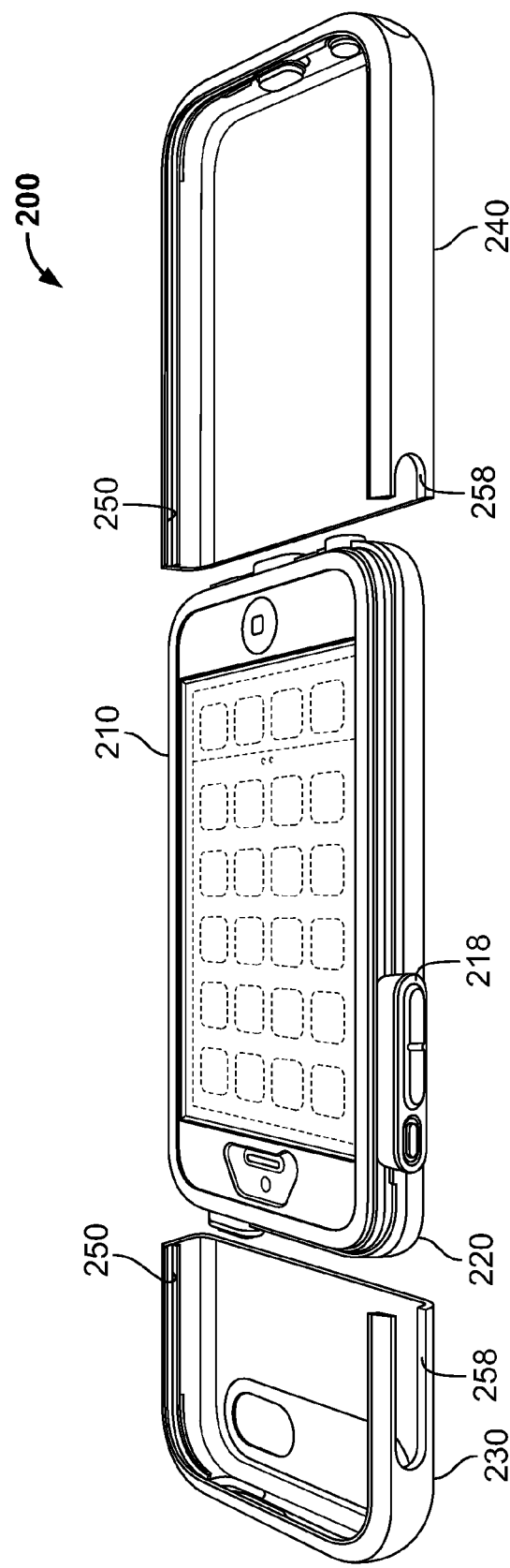
FIG. 14 is an exploded view of the case of FIG. 10, showing backing elements being installed over the top and bottom shells, in turn, assembled around a mobile device.

FIG. 10 shows an exploded view of a top shell 210 and bottom shell 220 of a second embodiment of the device case, identified as case 200 (see FIG. 14.) This case functions in the same manner as case 100 in that it is comprised of a top and bottom shell that come together along a sealed boundary to form an outward protrusion that is then used as a track to slide upper and lower backing elements together to retain the shells together. However, in this case, only the upper shell 210 has an outward protrusion (see element 212 of FIG. 11), which aligns with an outer wall 222 of the lower shell 220. As with case 100, the top shell 210 of case 200 has a top edge 214, a bottom edge 215, and sides 216 and 217. It also has a downward extension 209, ending in a joining seal 253 that circles the perimeter of the shell and seats inside a channel formed in the bottom shell 220. The channel is formed between the inner wall 221 and the outer wall 222 of the bottom shell 220. Protrusion 212 comes to rest on the top of the outer wall 222, as shown in the cross section view of FIG. 11. Extending outward from the downward edge 209 along the perimeter of the top shell 210 are lightning port cover 211 and controls overmold 218. As will be seen, the controls overmold 218 serves the additional function of helping retain the upper and lower backing elements 230 and 240 together.

Bottom shell 220 similarly has a top edge 228, bottom edge 229 and sides 227 forming its perimeter. Around the perimeter, it features inner wall 221 and outer wall 222, the latter of which has cutouts at certain intervals to accommodate the overmolds and covers (e.g., 211 and 218) of the top shell 210. The inner wall 221 and outer wall 222 cooperate to form a trench that extends along the inner perimeter of the bottom shell 220 and accommodates the joining seal 253. Though shown as being fixed to the distal end of the downward extension 209 of the upper shell 210, it will be understood that the joining seal 253 could alternatively be molded into the trench, such that it remains with the bottom shell 220 when the top shell 210 is pulled away.

Figure 11:
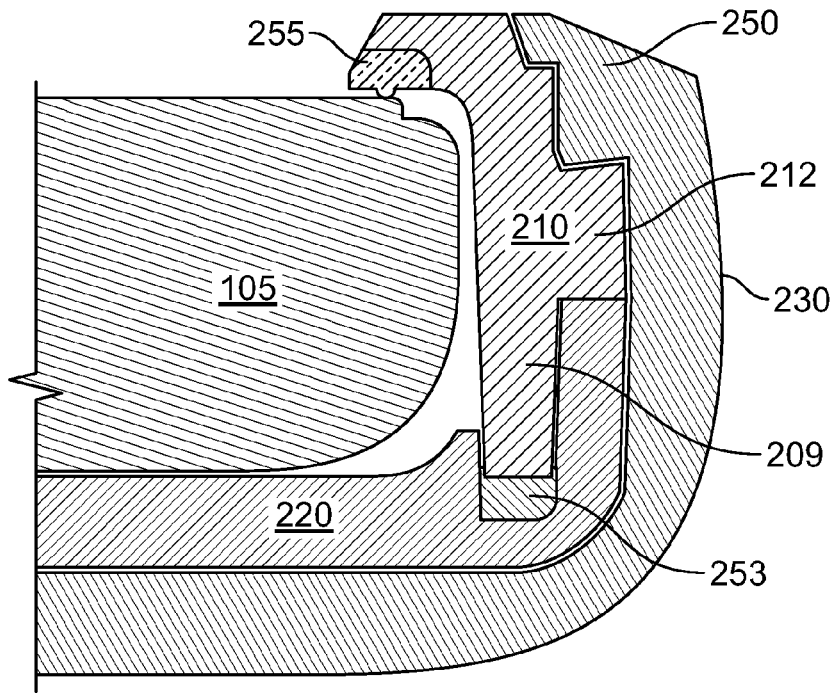
FIG. 11 is a section view taken through a side of a fully assembled case having no membrane in accordance with the embodiment shown in FIG. 10.
Figure 11A:
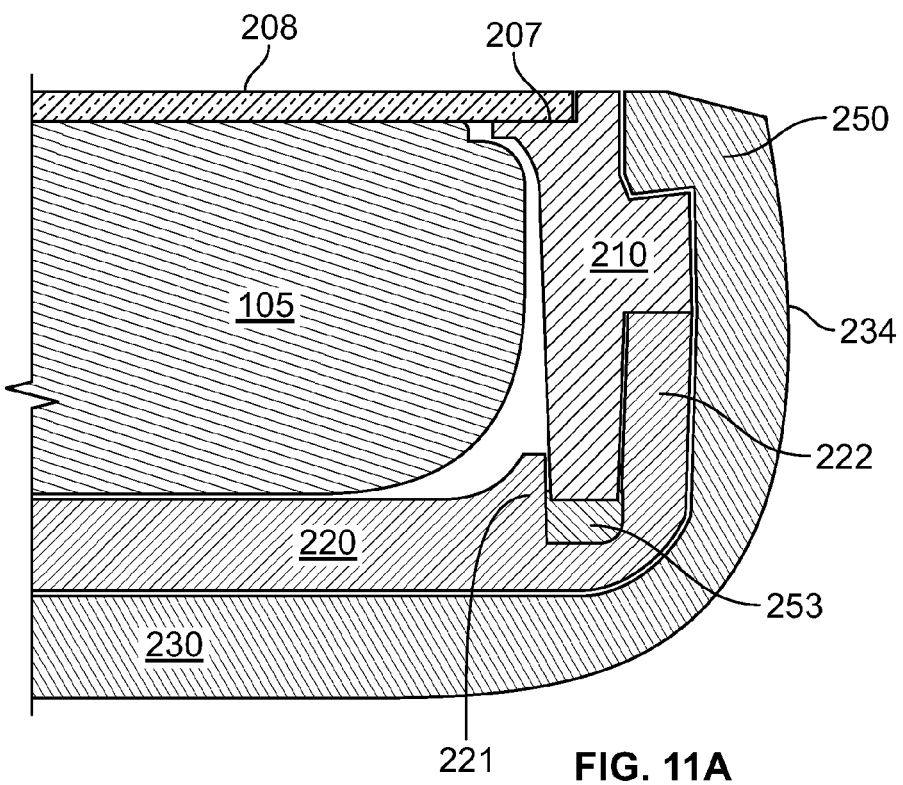
FIG. 11A is a section view taken through a side of a fully assembled case having a membrane in accordance with the embodiment shown in FIG. 10.

FIGS. 11 and 11A show cross-sections taken along the upper portion of a fully assembled case 200 (not shown), mirroring the location where the section of FIG. 3 is taken for case 100. However, the top shell 210 varies slightly between FIG. 11 and FIG. 11A. The case 200 of FIG. 11 features a perimeter seal 255 much like that of case 100 shown in FIG. 3. The perimeter seal seats around the perimeter of the interactive screen of device 105, and is pressed down by the hard plastic component of top shell 210 being pulled down against it by the backing element 230 compressing the top shell 210 and bottom shell 220 together. This results in a raised protective rim, such as is found in some form or another in nearly every device case on the market.

The top shell 210 of FIG. 11A departs from this in that there is no protective rim. The top surface of the case, when fully assembled, is completely flush, and takes on the same shape as the device 105 which it protects. Here, the case 200 includes a membrane 208, which expands across the top surface of the device when the case is fully assembled with device 105 installed. The membrane is translucent, and configured to allow touch-screen operability and interaction with the device. For example, the membrane might be made of materials such as Corning Gorilla Glass®. The membrane 208 seats on a shelf 207 formed around the top of the top shelf, and may be fixed there via a variety of known means, such as adhesives, and/or an interference fit with the portion of the top shell 210 extending above the shelf 207. The mating edges of top shell 210 and upper backing element 230 (and lower backing element 240—not shown) also changes slightly between the cases of FIGS. 11 and 11A.

Figure 12:
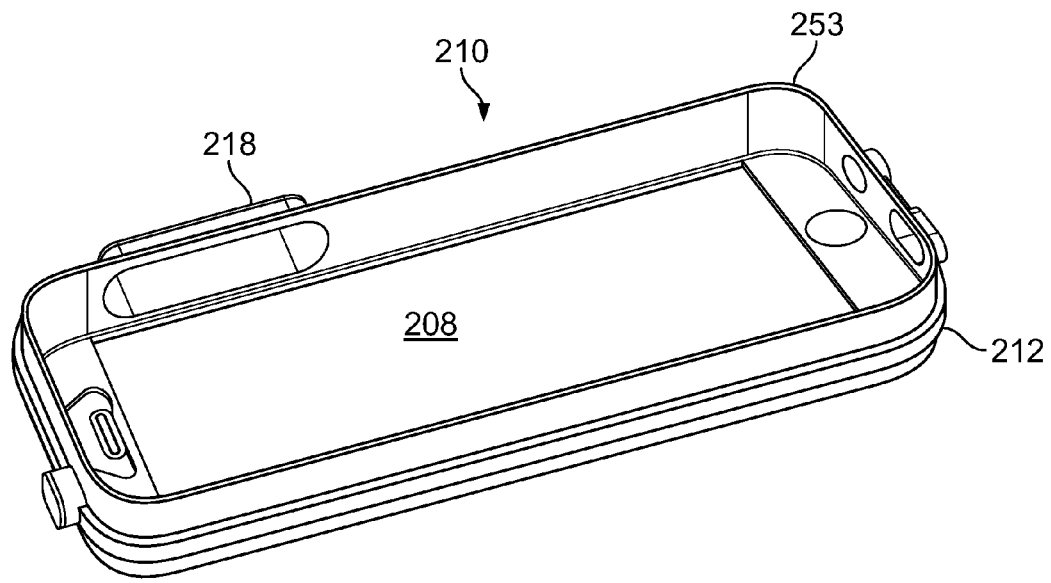
FIG. 12 is a perspective view of the underside of the top shell of the case of FIG. 10.
Figure 13:
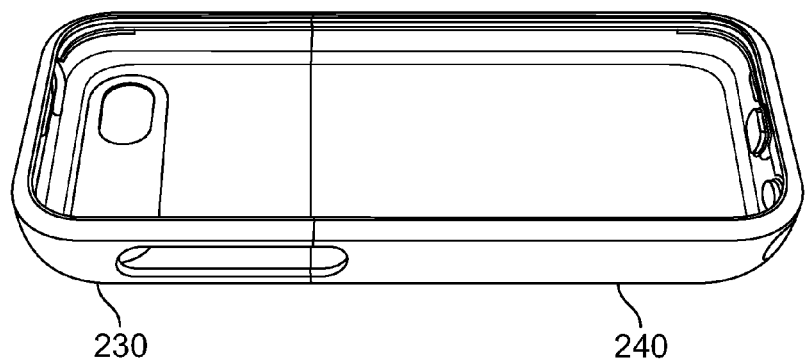
FIG. 13 is a perspective view of the upper and lower backing elements of the case of FIG. 10.

FIG. 12 shows the inside surface of a top shell 210 equipped with a membrane 208, such as that shown in section view of FIG. 11A. As can be seen, the device 105 is seated in this shell prior to the bottom shell 220 being placed over it. With these assembled, the backing elements are slid over the protrusion formed by 212 and the outer wall 222 of the bottom shell 210. FIG. 13 shows the upper backing element 230 and lower backing element 240 pressed together along their joining interface. Each backing element features upstanding side walls 134/144 respectively. The lower backing element 240 has an upstanding bottom wall 248, while the upper backing element 230 has an upstanding top wall 238. Each of the upstanding walls comprise a portion of lip 250 that runs around the perimeter of the combined backing elements and extends over the top of protrusion 212 of the top shell 210 in order to pull the top and bottom shells together and retain them in a sealed position.

Finally, as shown in FIG. 14, once the top shell and bottom shell are assembled around the device 105, the upper and lower backing elements 230 and 240 are slid over the sides 217/227 of the assembled shells to held them together. In this illustrated embodiment, there is no twist lock assembly or separate retaining device. Rather, the backing elements are pressed over the control overmold 218. The overmold is ideally made of a pliable, resilient material that helps retain the backing elements when the cutout 258 is pressed over it.

Figure 1A:
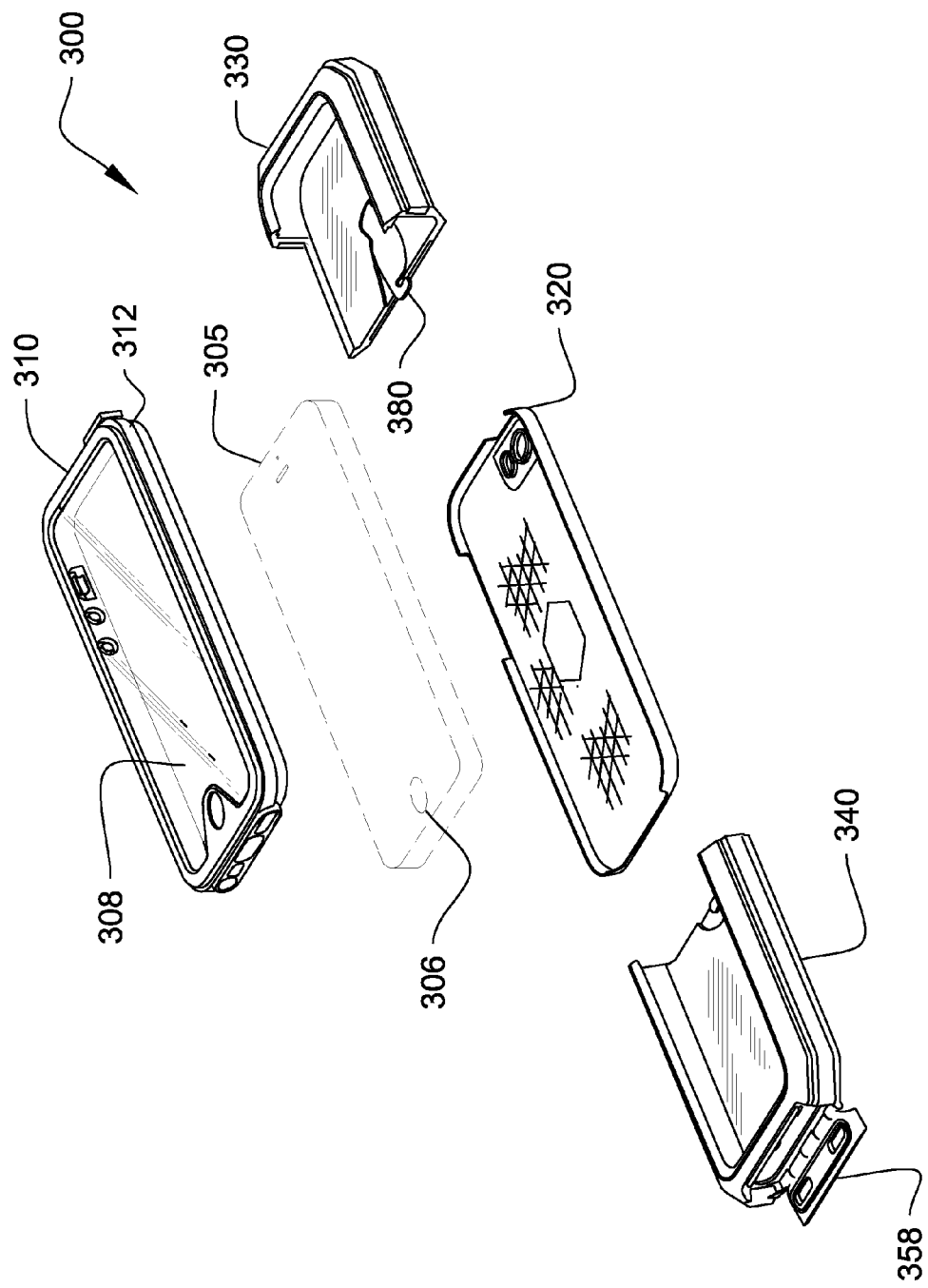
FIG. 1A is an exploded view of case components forming around a mobile device in accordance with a second exemplary embodiment.

FIG. 1A shows a third embodiment of the present invention that varies in slight ways from the first two embodiments. Notably, case 300 still adheres to the concept of securing top and bottom clam shells together using slide-over backing elements. In FIG. 1A is shown a mobile device 305 that is to be fit between a top shell 310 and a bottom shell 320. The top shell has a translucent membrane 308, such that the mobile device 305 will be completely enclosed. However, shells 310 and 320 have no clasping mechanism on them such that they will not remain together around the device on their own. Instead, upper backing element 330 and lower backing element 340 are slid over a protrusion 312 formed in the frame of the top shell. Like that of case 100 (See FIG. 6), case 300 comprises a lock assembly 380 that is used to draw the backing elements 330 and 340 together so as to fully secure the mobile device 305. Once fully installed, the mobile device 305 cannot be removed without unlocking the lock assembly 380. This may or may not require a tool, depending on the particular embodiment.

Figure 1B:
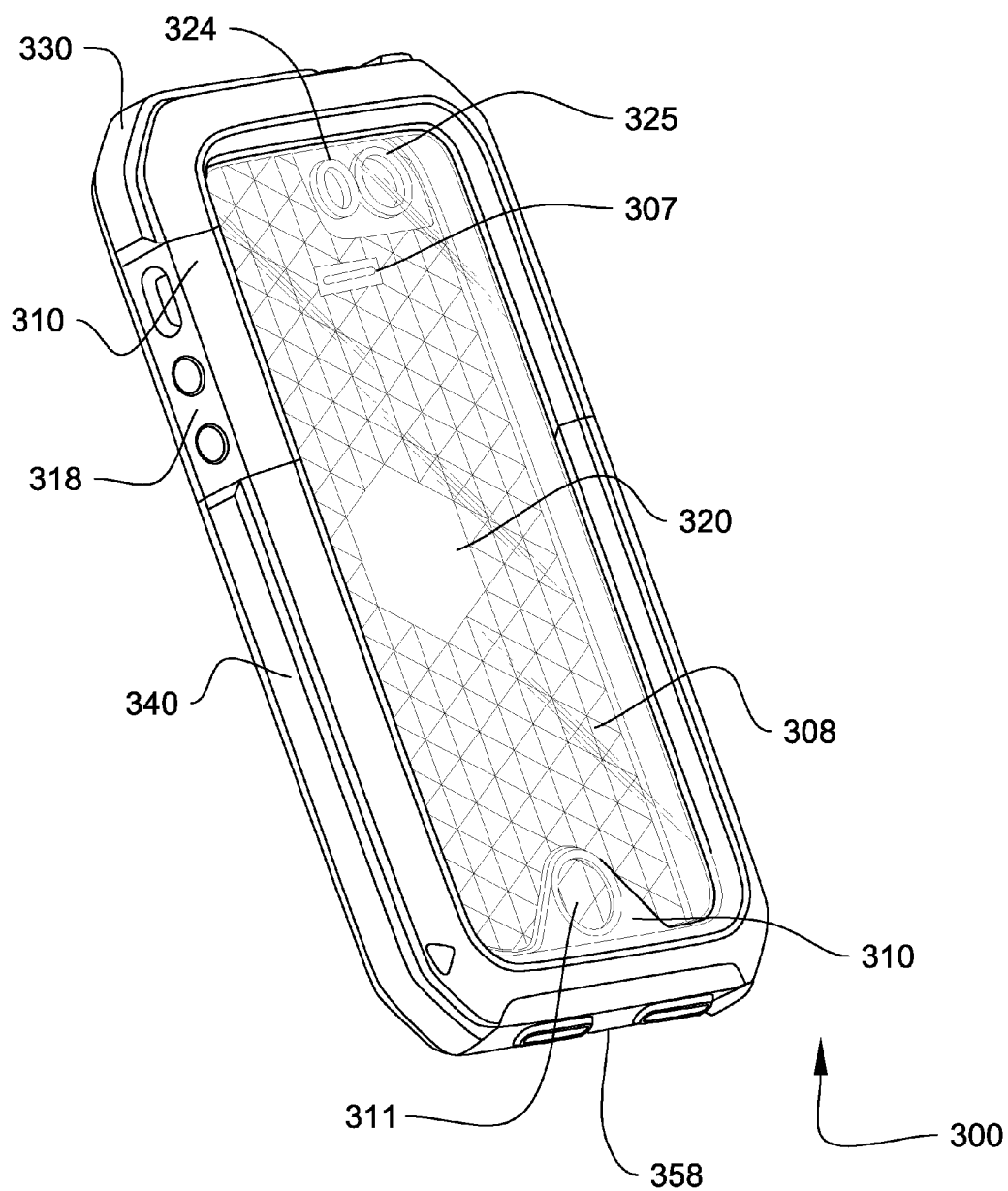
FIG. 1B is a front isometric view of the case of FIG. 1A when fully assembled, but with the mobile device not included.

FIG. 1B shows a fully assembled case 300 without a mobile device 305 installed. In this particular example, the case 300 is configured to support an IPHONE 5S. However, it will be understood that the principles and constructions taught could simply be repositioned so as to accommodate other mobile device designs. As shown in FIG. 1B, the top shell 310 includes a controls overmold 318 similar to that of case 200 (See FIG. 10, Element 218). However, as will be seen, the upper backing element 330 does not extend around it along the top side. Looking through the membrane 308 of the top shell 310, the inside surface of bottom shell 320 is visible. In this case, a pattern has been formed into a pliable bottom shell insert 322, discussed further below. Also visible through the membrane are the flash buffer 324 and camera buffer 325 that are components of the bottom shell and used to protect lighting around the camera flash from the mobile device 305.

At the bottom end of the case 300 is a power cable door 358 formed in the lower backing element 340. This door opens to allow connection of a charging cable, but closes so as to seal off the power port as well as the speaker and microphone as discussed below. Also shown in a separate sensor pad 311 fitted into the top shell to align with the fingerprint sensor of the IPHONE 5S. Unlike the membrane 308, which is, for example, a rigid glass, the sensor pad 311 allows for the characteristics of a user's fingerprint to be translated through to the mobile device 305 to unlock access to the device while still secured within the case 300. The sensor pad 311 is ideally positioned beneath the membrane 308 to which it is mounted, such that the pad 311 is flush with the Touch ID home button of the mobile device 305 in its resting state. The pad 311 is bonded by an adhesive or ultrasonic welding to the membrane seal, which is, in turn, fixed to the inner surface of the top shell 310. In this manner, the pad 311 functions to convey fingerprints to the device, but the case 300 is still watertight in the area.

Figure 4A:
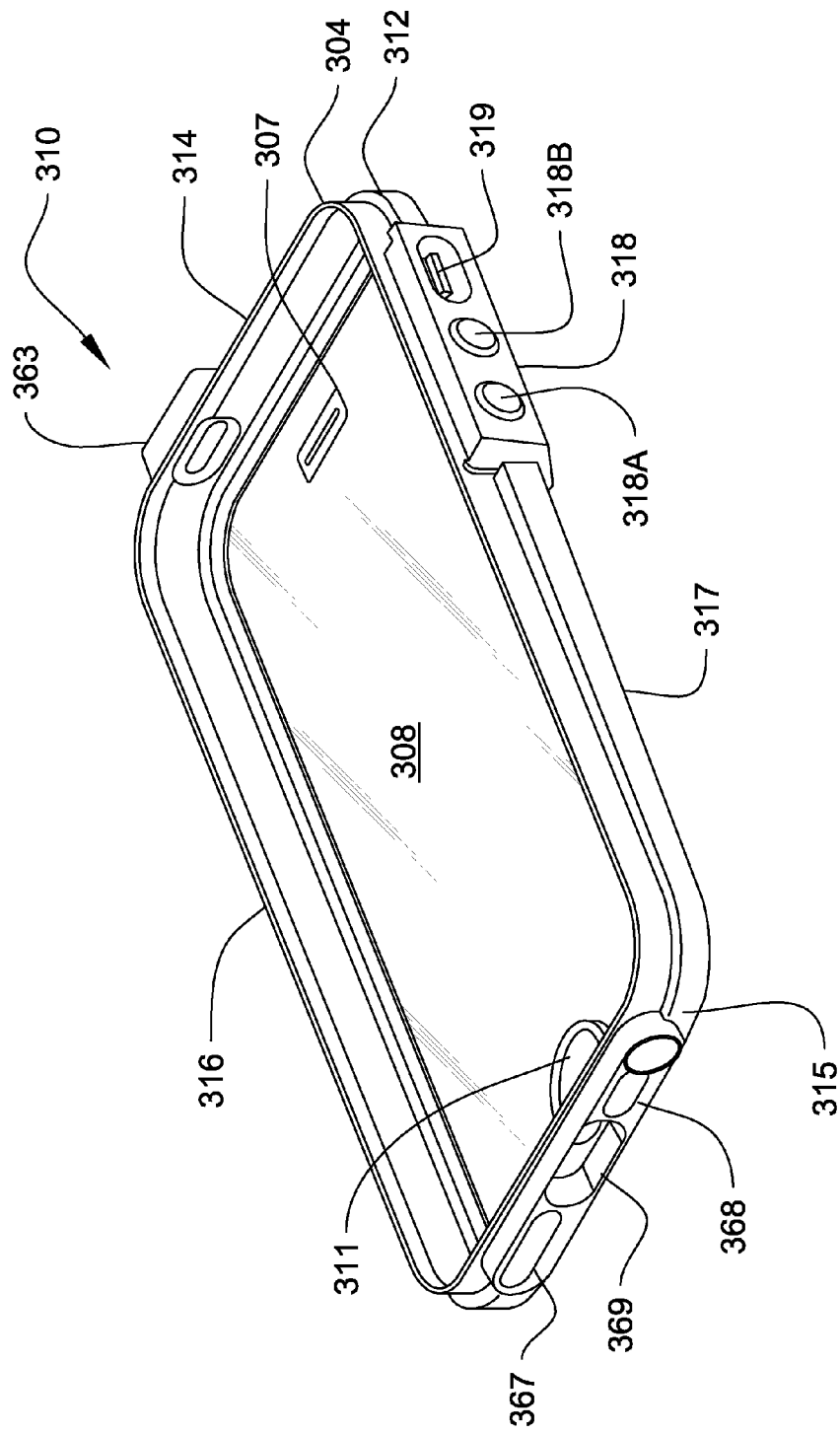
FIG. 4A is a perspective view of the inner side of the top shell of the case of FIG. 1A.

FIG. 4A shows the inside of top shell 310, which forms a cradle into which the mobile device is placed, with its view screen down toward membrane 308. The membrane 308 has an ear port 307 with a water-proof seal placed over it to allow sound to pass (i.e., when someone is listening to the device as in a phone conversation) but not water. As with prior embodiments discussed, the top shell 310 has a top wall 314, a bottom wall 315, and opposing side walls 316 and 317. Protrusion 312 extends outward from at least each side wall 316 and 317 for purposes of helping seal the case 300. The protrusion also forms a shelf for the outer wall 323 of the lower shell 320, as shown best in FIG. 11B.

Along side wall 317 is the controls overmold 318, which features up and down volume overmolds 318A and 318B, as well as a toggle switch 319 for use in operating a mute selection on the mobile device 305 when it is installed in the case 300. Moving around the top wall 314, there is a sleep control seal 363 that allows sleep button 364 to be operated while preventing the ingress of liquids. Opposite that are three holes in the bottom wall 315: microphone port 367, speaker port 368 and power port 369. These ports are always open and are not sealed by the top shell itself. Rather, they are sealed from outside liquids by the power cable door 358 of the lower backing element 340. Again, it will be understood that these ports are configured for a particular mobile device 305, but could be located elsewhere along the perimeter of the case 300 as needed to accommodate other designs.

Figure 4B:
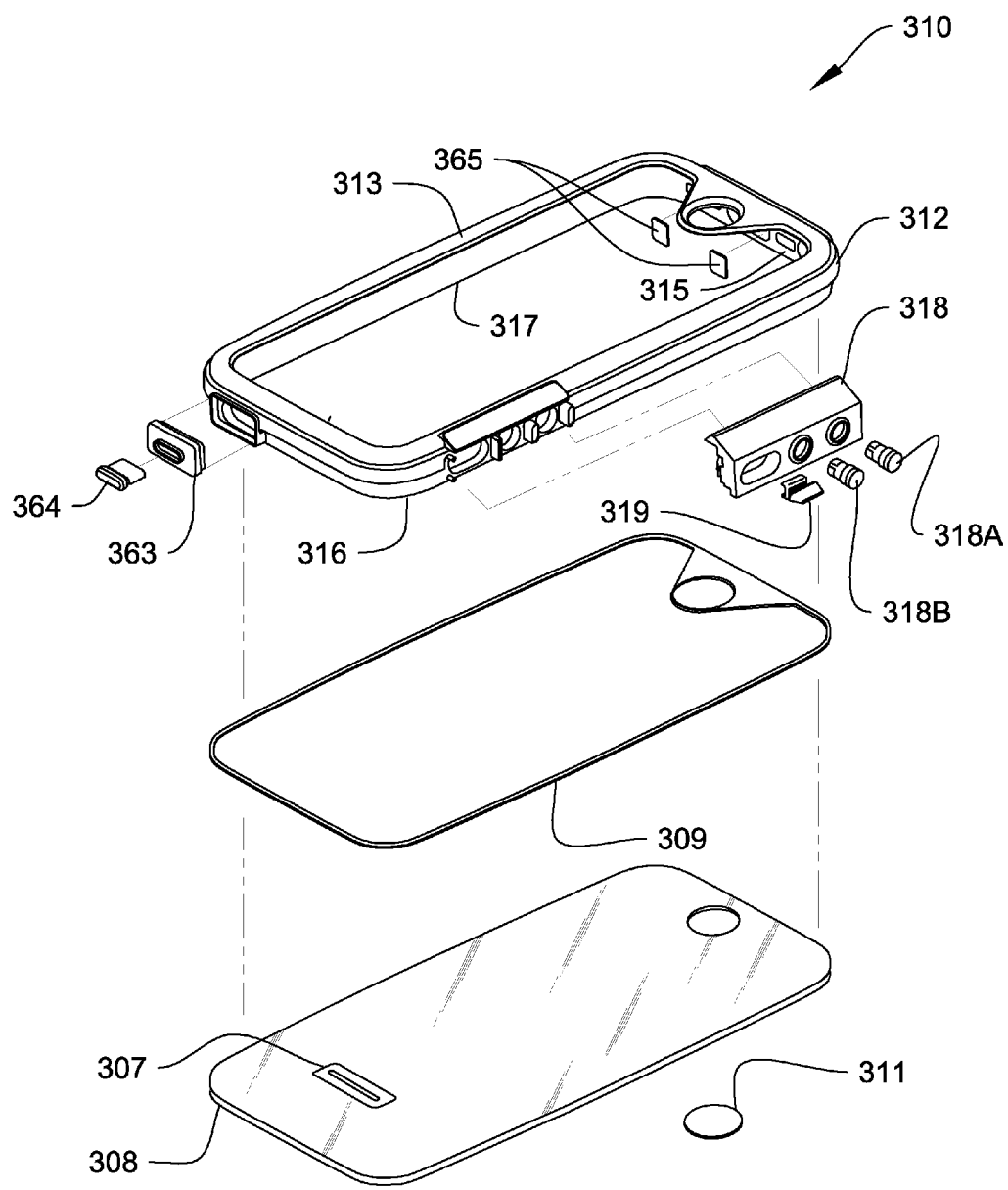
FIG. 4B is an exploded view of the elements of the top shell shown in FIG. 4A.

FIG. 4B provides an exploded view of the top shell 310 shown in FIG. 4A, but showing the outer or top surface. As shown, the top shell 310 includes a perimeter frame 313, which is preferably of a rigid material. The protrusion 312 is a rigid surface feature of the frame 313 and extends at least along the side walls 316 and 317. Controls overmold 318 is of a flexible or semi-flexible material such as a polymer that provides a watertight seal in the perimeter openings through which the controls 318A, 318B and 319 operate to contact corresponding controls on the device 305. In this same manner, sleep control seal 363 is flexible and covers around the sleep button 364. Foam seals 365 cover over the speaker and microphone ports through the bottom wall 315 of the top shell frame 313. Below the top shell frame 313 are the membrane seal 309, the membrane 308, and the sensor pad 311. Once assembled during manufacture, the components shown on FIG. 4B are generally intended to stay together as one single component—the top shell 310.

Figure 5A:
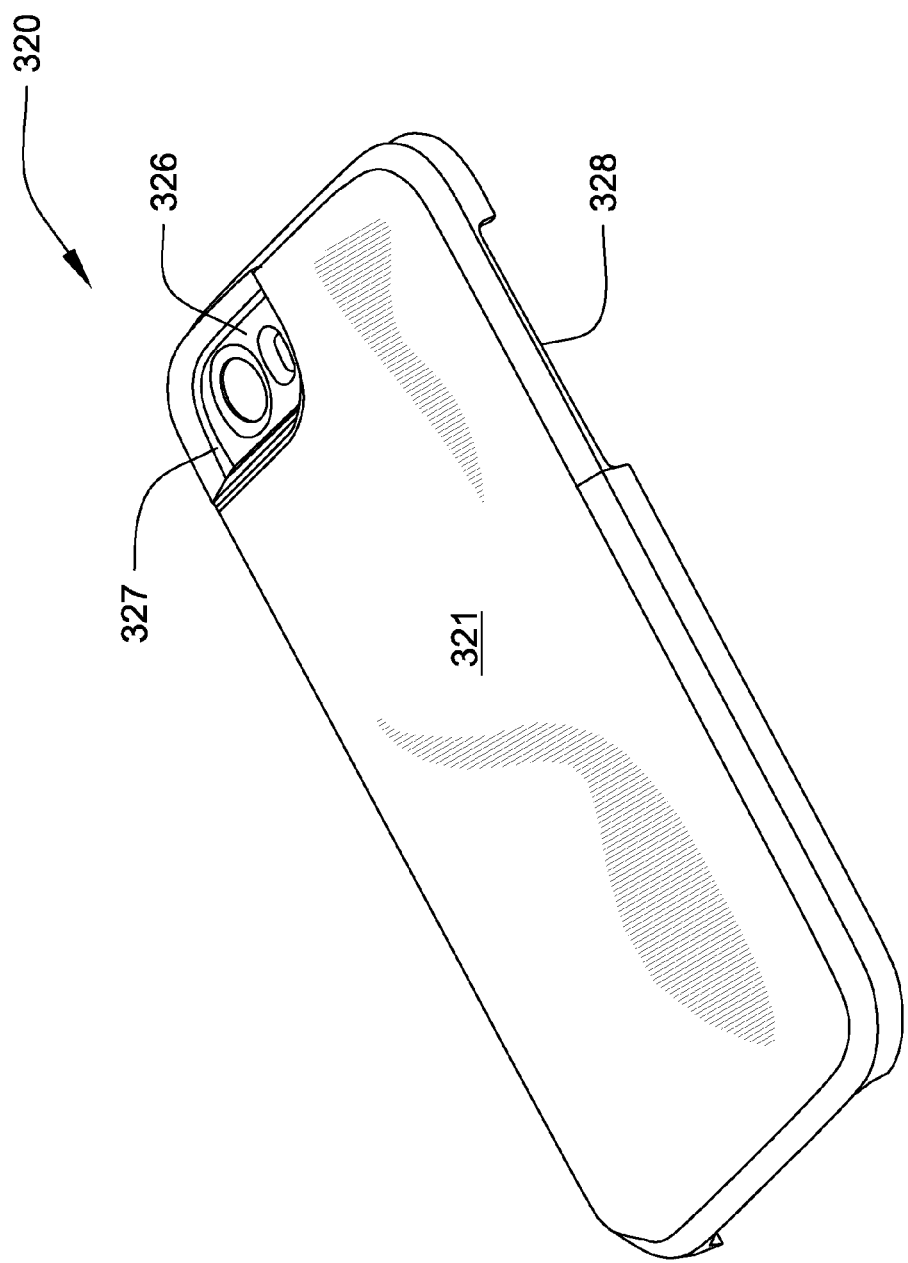
FIG. 5A is a perspective view of the outer side of the bottom shell of the case of FIG. 1A.

FIG. 5A shows an isometric rear view of the bottom shell 320. Like the top shell 310, the bottom shell 320 is preferably of a rigid construction, though it has components that are not rigid. From the rear or outer side of the bottom shell 320, primarily the bottom shell frame 321 is all that is visible. The frame 321 has sidewalls, a top wall and bottom wall in the illustrated embodiment, but the walls are shorter than those of the top shell 310. That is why insertion of the mobile device 305 is performed by placing the device face first into the top shell and then placing the bottom shell 320 over the backside of the device before sliding the backing elements on. In the illustrated embodiment the side wall in view has a controls cutaway to provide room for the controls overmold 318 of the top shell 310. It will be understood that this geometry could be reversed such that the controls overmold is part of the bottom shell 320 and the bottom shell 320 has the higher walls instead of the top shell 310 without departing from the spirit of the invention. At the top left corner of the outer surface of the bottom shell 320 is shown a camera hole 327. This hole supports the camera seal assembly 326, which is more clearly illustrated in FIG. 5B.

Figure 5B:
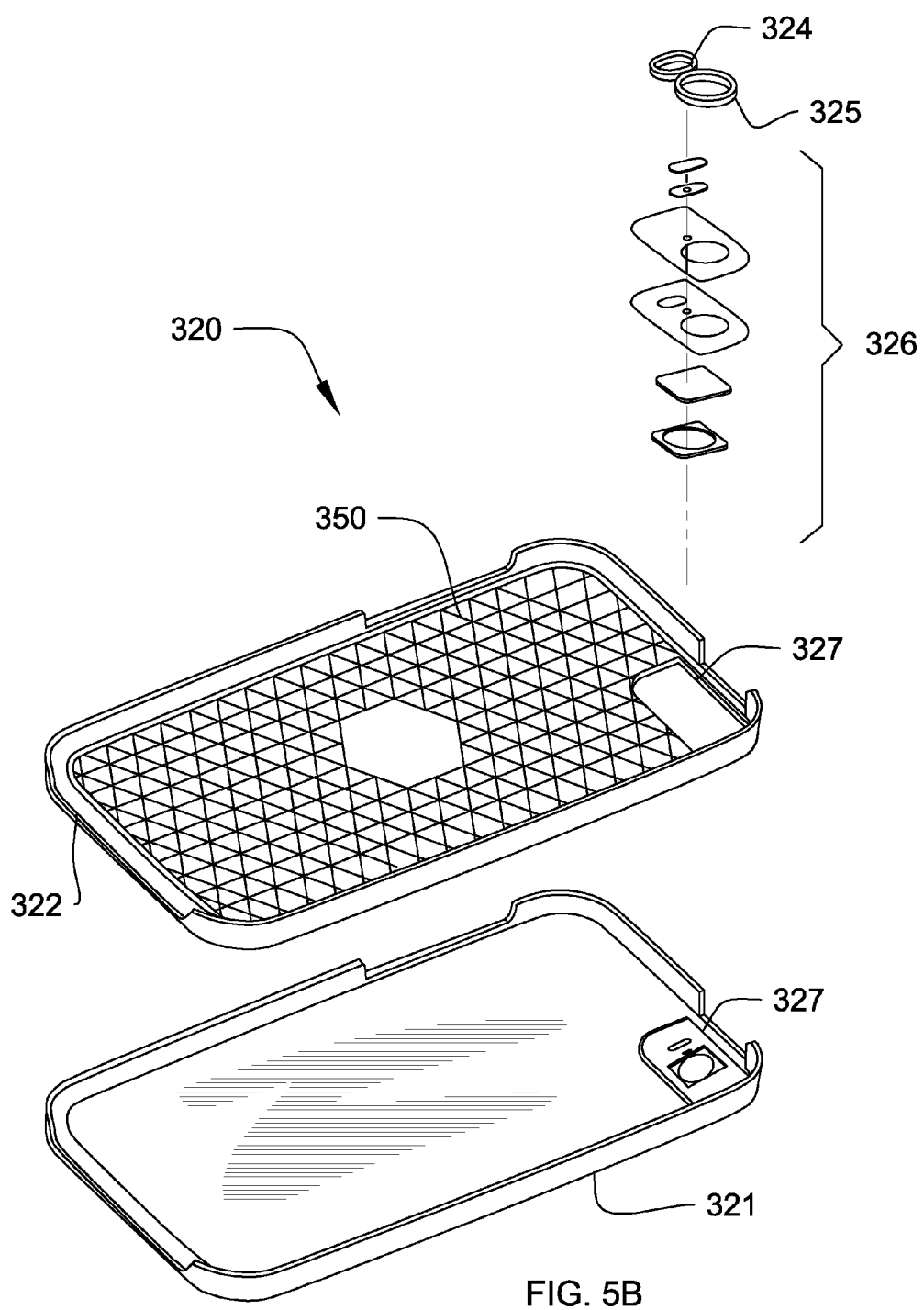
FIG. 5B is an exploded view of the elements of the bottom shell shown in FIG. 5A.

FIG. 5B is an exploded view of the bottom shell 320 taken from the other side (the inner side) of the shell. At bottom is the shell frame 321 with its camera hole 327. Above that is a bottom shell lining 322. While the frame 321 is rigid, the lining 322 is flexible or semi-flexible and may be molded into a pattern such as that shown. The pattern may have some depth such that it forms ribs 350 for cushioning the back of the mobile device 305. These ribs may be few or many, large or small, but ideally should only rise just slightly (perhaps a millimeter) off of the inner surface of the lining 322. The lining 322 generally is of the same shape as the frame 321, but slightly smaller so as to fit on its inside. In the exemplary embodiment, the lining is permanently co-molded or over-molded to the frame such that they form a single, inseparable component. The lining 322 also has a camera hole 327, which joins to the hole in the frame to support the seal assembly 326 and the flash buffer 324 and camera buffer 325. These buffers help control light distribution while the seals help to prevent water ingress.

Figure 7A:
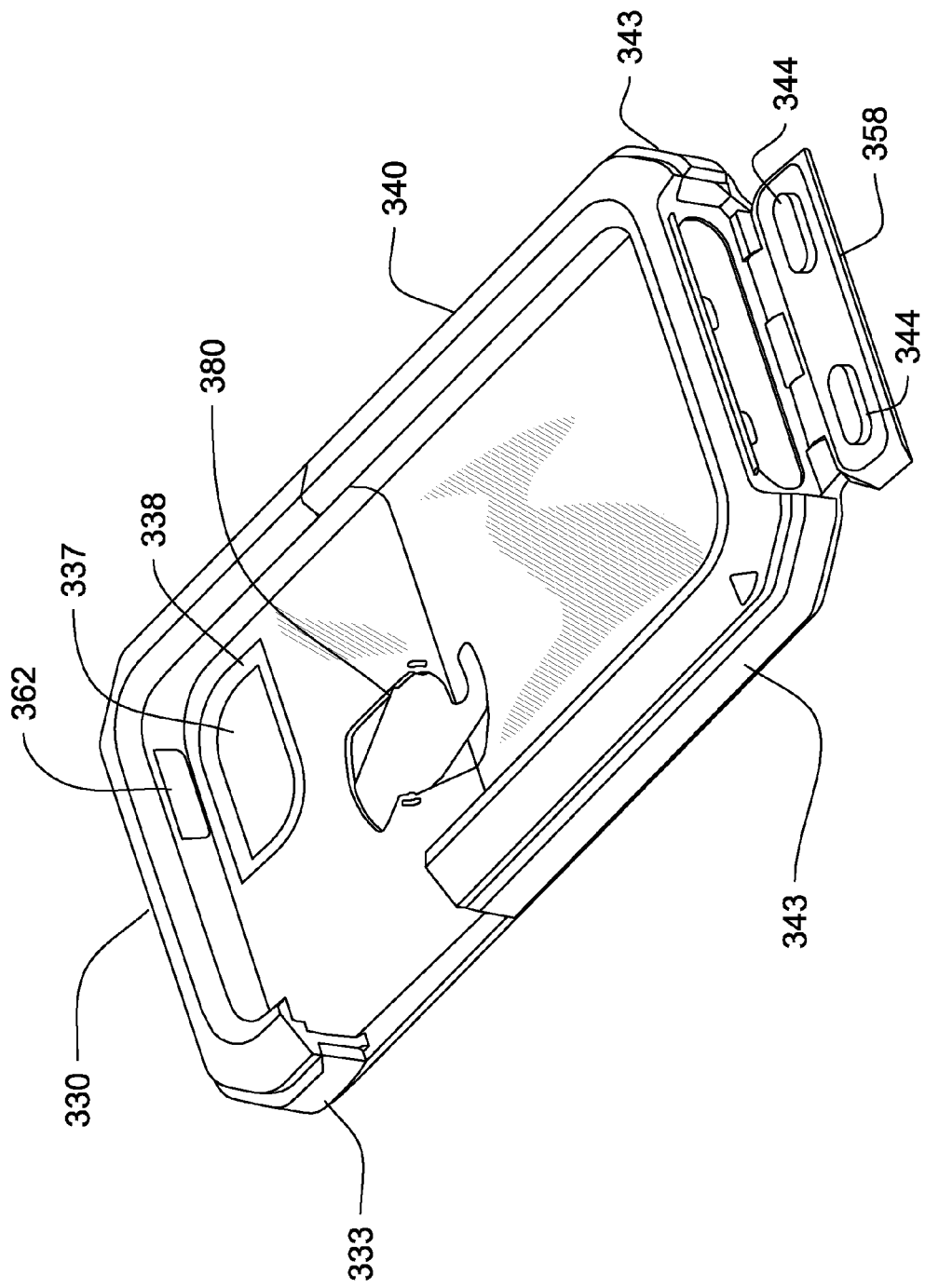
FIG. 7A is front isometric view of the upper and lower backing elements of the case of FIG. 1A locked together, with the connection door opened.
Figure 7B:
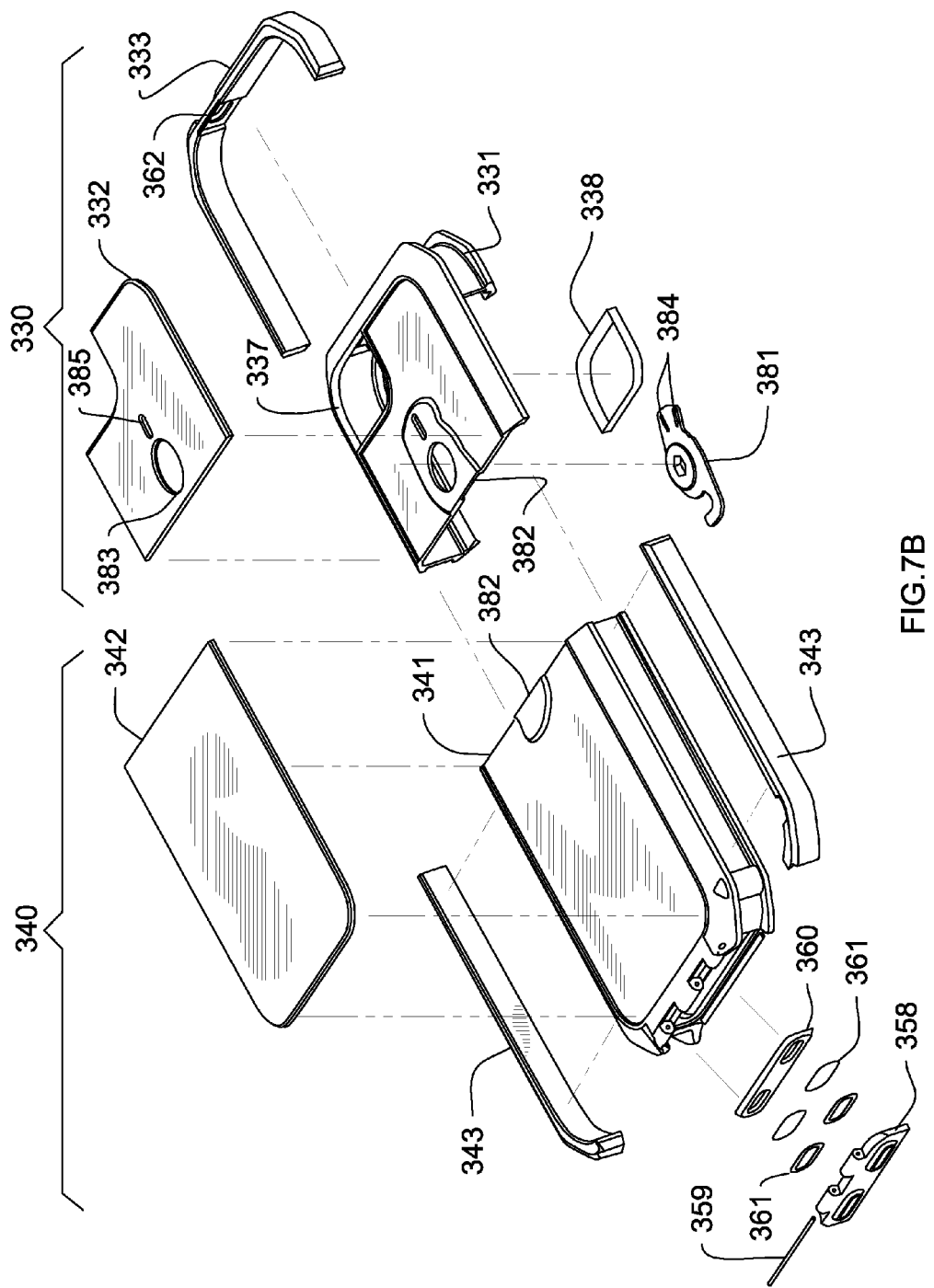
FIG. 7B is an exploded view of the components of the backing elements shown in FIG. 7A.

FIG. 7 shows a rear view of the fully assembled case 300, but primarily serves to illustrate the rear of the backing elements 330 and 340 now installed. As indicated, the outer perimeter of the backing elements 330 and 340 are guarded by upper backing bumper 333 and lower backing bumper 343, respectively. While the upper and lower backing frames 331 and 341 (see FIG. 7B) are ideally of a rigid plastic or metal, the bumpers are flexible and assist in cushioning impact. Power cable door 358 is shown in the closed position at the bottom of the lower backing element 340. Camera hole 337 (which aligns with camera hole 327 in the bottom shell 320) is shown in the upper left corner of the upper backing element 330. Controls 319, 318A and 318B appear along the right side, where the perimeter of the upper backing element 330 is trimmed away to allow space for them. Certain components of the lock assembly 380 are visible in this view. Specifically, lock wheel 381, with its cam hole 386, are present as well as the position indicator hole 385, which serves to identify to the user whether the backing elements have been secured together or not. The case 300 may also include a key or tool (not shown) for insertion into the cam hole 386 for use in turning lock wheel 381.

FIG. 7A shows the upper and lower backing elements 330 and 340 from the other side (exposing their inner surfaces). While the elements are shown locked together for purposes of explanation, this would typically not be done unless the backing elements were first slid over the sub-assembled top and bottom shells 310/320, which would in turn contain the mobile device 305. Generally, the backing elements form an outer perimeter of the case 300, with breaks or holes corresponding to the control features of the mobile device 305 it is configured for use with—in this case, an IPHONE 5S. This includes control port 362, camera hole 337 and the break for the control overmold 318 (not shown here) which extends through the side wall of the upper backing element 330. In this view, the power cable door 358 is shown in the open position, thus allowing access to charge the mobile device 305. When closed, this door provides a watertight seal around the opening otherwise formed in the bottom wall of the lower backing element 340. The door 358 is held closed, at least in part, but the seal plugs 344, which are inserted into corresponding openings in the top shell 310 (e.g., the speaker port 367 and microphone port 368 of FIG. 4A). In this view, the inner surface of the lock assembly 380 is plainly in view showing that the lock wheel 381 on the outer side has been turned so as to draw the backing elements together. This would normally not be visible because it would be occluded by the bottom shell 320.

FIG. 7B shows an exploded view of both backing elements 330 and 340 from a rear isometric angle. As shown, the lower backing element 340 comprises a backing frame 341, which is typically a single, rigid molded plastic, side bumpers 343 and back pad 342. Just as the bumpers extend out to protect impacts from the sides, the back pad (also a flexible or semi-flexible polymer, typically) extends slightly beyond frame 341. It also covers over the lock wheel housing 382 formed partially in the lower backing element 340. The lower backing element also comprises components of the power access door 358, including the pin 359 on which it rotates as well as water and acoustic seals 361 and 360 that fit around or over the plugs 344.

The upper backing element 330 comprises a similar rigid, typically plastic molded frame 331 with depressions to receive bumper 333 along its perimeter and back pad 332 along its outer (rear) surface for impact absorption. Back pad 332, which is flexible or semi-flexible, has a cutout to keep the camera hole 337 uncovered, as well as a lock access hole 383 through which the lock wheel extends and the position indicator hole 385. The pad 332 covers over the remainder of the lock wheel housing 382 that is formed in the rear surface of the upper backing element. When assembled, the lock wheel 381 is placed in the lock wheel housing 382 such that the cam hole 386 is accessible from the outside of the back pad 332. The lock wheel assembly 380 has two positions (open and closed) corresponding with the two detents 384. In the open position, a first detent will appear through the position indicator hole 385. In the closed position, the second detent will so appear. The detents may be color coded, for example, with green indicating closed and red indicating opened. In other embodiments, there may be two position indicator holes 385A and 385B positioned such that, in a closed position, the lock wheel 381 positions a color patch under hole 385A and, in an open position, the lock wheel 381 positions a color patch under hole 385B. These cameral holes might be formed in the shape of a closed and open padlock, for instance, respectively. Finally, camera trim insert 338 fits around the camera hole 337 to help control lighting for the camera feature of the mobile device 305.

Figure 11B:
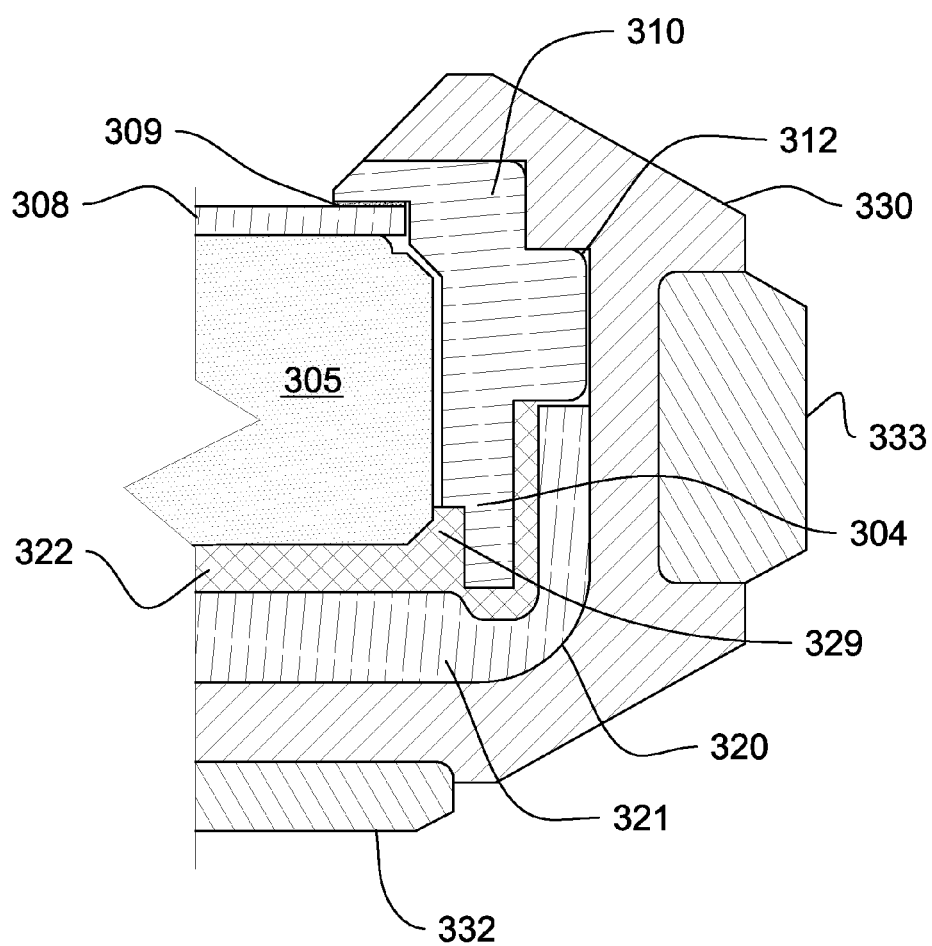
FIG. 11B is a section view taken through the side of the case shown in FIG. 7.

FIG. 11B shows a cross section taken through a side wall of the case 300 as shown in FIG. 7. This cross section illustrates the similarities and differences with case 200 (FIGS. 11 and 11A) and case 100 (FIG. 3). First, each case features a top shell (110, 210, 310) with a perimeter wall around the outside of a mobile device (105, 205, 305), where the wall features a downward extension (109, 210, 304) that fits at least partially into a trench formed by the perimeter of the bottom shell (120, 220, 320). In each case, the top shell features an outward protrusion (112, 212, 312) along its perimeter wall that abuts an outer portion of the bottom shell. In each case, the upper backing element (130, 230, 330) forms a housing that extends around the exterior of the bottom shell and at least a portion of the top shell to grip around the protrusion (112, 212, 312) to hold the top shell and bottom shell together.

After acknowledging those similarities, there are some differences. Like the section of FIG. 11A (case 200), FIG. 11B (case 300) includes a membrane (208, 308). In FIG. 11B, the membrane 308 is attached to the perimeter of the top shell 310 by the adhesive membrane seal 309. But it also has a raised perimeter like the sections in FIG. 11 and FIG. 3 (case 100), which does not exist in FIG. 11A. Cases 100 and 200 each feature at least a joining seal (153, 253) that is compressed when the top shell downward extension fits into the channel formed by the bottom shell. Case 300 uses no such seal. Rather, the bottom shell comprises a compressible lining 322 that forms an interior surface of both the channel and the entire bottom shell 320. Case 300 has bumpers (333) and back pads (332) to soften impact. While these could be added to cases 100 and 200, case 200 has none as shown in FIGS. 11 and 11A, and case 100 only has the side bumpers (133) as shown in FIG. 3.

It will be understood by those skilled in the art that various changes may be made and equivalents may be substituted without departing from the scope of the novel and non-obvious techniques disclosed in this application. For example, a single backing element running the length of the top and bottom shells might be substituted, such that it could slide along the entire length of the outward protrusion formed by the mating edges of the top and bottom shells. Moreover, the dimensions of the protrusions and the shapes of both the top and bottom shells could be different than shown in the illustrated embodiments without departing from the concepts claimed below and enabled herein. In addition, many modifications may be made to adapt a particular situation or material to the teachings of the novel techniques without departing from its scope. Therefore, it is intended that the novel techniques not be limited to the particular techniques disclosed, but that they will include all techniques falling within the scope of the appended claims. It is noted that each of the embodiments illustrated in the figures and discussed herein are of the variety including top and bottom clam shells that are placed together around a mobile device and sealed together by backing elements that slide together over the exterior sides of the clam shells.

What is claimed is:

1. A case for a generally rectangular mobile device having a front surface with an interactive control panel thereon, a back surface, a top surface, a bottom surface and first and second side surfaces, the case comprising:
    a top shell forming a perimeter around the interactive control panel of the mobile device and comprising a first side wall extending toward the back surface of the device along the first side surface of the device, and a second side wall extending toward the back surface of the device along the second side surface of the device, each of the first and second side walls comprising a downward extension and an outward protrusion, each outward protrusion forming a rail that marks the furthest outward point of the top shell away from the interactive control panel along the side wall from which the outward protrusion extends;
    a bottom shell forming a cradle for the bottom surface of the mobile device and comprising a first upstanding perimeter wall along at least a portion of the first side surface of the mobile device and a second upstanding perimeter wall along at least a portion of the second side surface of the mobile device, wherein:
        the first upstanding perimeter wall forms a first trench outward of the first side surface of the mobile device for receiving at least a portion of the downward extension of the first side wall of the top shell; and
        the second upstanding perimeter wall forms a second trench outward of the second side surface of the mobile device for receiving at least a portion of the downward extension of the second side wall of the top shell;
    an upper backing element configured to slide along the rails of the top shell from the top surface of the mobile device; and
    a lower backing element configured to slide along the rails of the top shell from the bottom surface of the mobile device;
    wherein the upper and lower backing elements join together along a parting line between the top surface and bottom surface of the mobile device to at least partially encompass the bottom shell, and extend substantially parallel to the first and second side surfaces of the mobile device, beyond the first and second perimeter walls of the bottom shell, and around the rails formed by the outward protrusions of the top shell to hold the top shell and bottom shell together around the mobile device.

2. The case of claim 1, wherein the lower backing element comprises a watertight door pivotable about a pin for providing access to a charging port of the mobile device.

3. The case of claim 1, further comprising a lock assembly partially disposed in each of the lower backing element and the upper backing element for use in drawing the lower backing element and upper backing element together around the top shell and the bottom shell.

4. The case of claim 2, wherein the lock assembly comprises a lock wheel disposed in the upper backing element, and a catch receptacle disposed in the lower backing element, and wherein the lock wheel is configured to rotate a catch connected to the upper backing element into the catch receptacle such that rotation of the lock wheel pulls the backing elements together.

5. The case of claim 4, further comprising a position indicator for indicating whether the lock wheel is in a locked or unlocked position.

6. The case of claim 1 further comprising a membrane covering the interactive touch screen of the mobile device, the membrane connected to the perimeter of the top shell and comprising a hole for providing access to a fingerprint reading sensor on the mobile device.

7. The case of claim 6, further comprising a sensor pad fixed to the underside of the membrane and covering the hole therein, the sensor pad preventing the passage of water, but permitting the passage of a fingerprint signature.

8. The case of claim 1, wherein the bottom shell comprises an exterior rigid frame extending across the back surface of the mobile device and an interior compliant liner, the frame and the liner being permanently affixed to one another, and the liner forming the first and second trenches.

9. The case of claim 8, wherein the interior compliant liner forms the cradle for the bottom surface of the mobile device, and presents a plurality of compliant, impact-absorbing ribs that rise up from the liner approximately 1 millimeter to cushion the back of the mobile device.

10. The case of claim 1, wherein the first and second upstanding perimeter walls of the bottom shell extend up so as to terminate against a downward facing shelf of the outward protrusions of the top shell side walls.

11. A waterproof, impact-resistant case for a handheld computing device, the device being of substantially rectangular proportions and having a front surface, a rear surface, a top edge, a bottom edge, and left and right side edges, the case comprising:
 a rigid top shell for placement over the front surface of the device, the top shell comprising:
  a left side wall extending from the front surface of the device, along the left side edge of the device to a side wall terminus near the rear surface of the device, the left side wall comprising an outward protrusion extending away from the left side edge of the device and forming a top shelf along and parallel to the left side edge; and,
  a right side wall extending from the front surface of the device, along the right side edge of the device to a side wall terminus near the rear surface of the device, the right side wall comprising an outward protrusion extending away from the right side edge of the device and forming a top shelf along and parallel to the right side edge;
 a bottom shell having an interior surface for placement against the rear surface of the device and an exterior surface facing away from the device, the bottom shell forming left and right trenches along and parallel to the left and right side edges of the device, the trenches each configured to receive a side wall terminus of the top shell;
 an upper backing element extending across a portion of the exterior surface of the bottom shell and along a portion of the side walls of the top shell, the upper backing element comprising an overhang sliding along the top shelf formed by the outer protrusions of the top shell; and
 a lower backing element extending across a portion of the exterior surface of the bottom shell and along a portion of the side walls of the top shell, the lower backing element comprising an overhang sliding along the top shelf formed by the outer protrusions of the top shell;
 wherein the upper backing element and the lower backing element are configured to slide together along the top shelf such that they join together along a parting line between the top edge and the bottom edge of the device and cooperate to form a raised protective perimeter around the top surface of the rigid top shell.

12. The case of claim 11, wherein the case completely encapsulates the device.

13. The case of claim 11, further comprising a lock assembly disposed in portions of the upper backing element and the lower backing element for use in securing the backing elements together.

14. The case of claim 13, wherein the lock assembly comprises a cam hole used to turn a lock wheel that actuates the locking assembly.

15. The case of claim 11, wherein the bottom shell comprises at least one port hole along the bottom edge of the device, and wherein the lower backing element comprises a pivoting door having a plug that inserts into the at least one port hole when the door is pivoted shut.

16. The case of claim 11, wherein the bottom shell comprises a rigid exterior portion extending across the rear surface of the mobile device and a flexible interior portion co-molded to the rigid exterior portion, the flexible interior portion providing a cushion for the rear surface of the mobile device.

17. The case of claim 16 further comprising ribs adjacent to the flexible interior portion, the ribs rising up approximately 1 millimeter from a surface of the flexible interior portion in order to support the rear surface of the device.

* * * * *